(12) United States Patent
Nobuto

(10) Patent No.: US 9,768,177 B2
(45) Date of Patent: Sep. 19, 2017

(54) METHOD OF FORMING CONDUCTIVE MATERIAL OF A BURIED TRANSISTOR GATE LINE AND METHOD OF FORMING A BURIED TRANSISTOR GATE LINE

(71) Applicant: Micron Technology, Inc., Boise, ID (US)

(72) Inventor: Hidekazu Nobuto, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/817,458

(22) Filed: Aug. 4, 2015

(65) Prior Publication Data
US 2017/0040327 A1    Feb. 9, 2017

(51) Int. Cl.
H01L 21/4763 (2006.01)
H01L 27/108 (2006.01)
H01L 21/768 (2006.01)
H01L 21/285 (2006.01)

(52) U.S. Cl.
CPC .. *H01L 27/10891* (2013.01); *H01L 21/28556* (2013.01); *H01L 21/28568* (2013.01); *H01L 21/76843* (2013.01); *H01L 21/76879* (2013.01); *H01L 27/10876* (2013.01)

(58) Field of Classification Search
CPC ......... H01L 2924/0002; H01L 2924/00; H01L 21/28518; H01L 29/665; H01L 21/28052; H01L 21/76834; H01L 23/53295; H01L 21/76807; H01L 21/76829; H01L 21/3148; H01L 21/76814; H01L 21/76832; H01L 29/66
See application file for complete search history.

(56) References Cited
U.S. PATENT DOCUMENTS

| | | | |
|---|---|---|---|
| 2010/0213541 A1* | 8/2010 | Jeon .................. | H01L 21/28088 257/334 |
| 2014/0120723 A1* | 5/2014 | Fu ..................... | H01L 21/28506 438/680 |
| 2015/0325475 A1* | 11/2015 | Bamnolker .......... | C23C 16/045 438/680 |

\* cited by examiner

*Primary Examiner* — Robert Bachner
(74) *Attorney, Agent, or Firm* — Wells St. John P.S.

(57) ABSTRACT

A method of forming conductive material of a buried transistor gate line includes adhering a precursor comprising tungsten and chlorine to material within a substrate trench. The precursor is reduced with hydrogen to form elemental-form tungsten material over the material within the substrate trench from the precursor.

23 Claims, 23 Drawing Sheets

METHOD OF FORMING CONDUCTIVE MATERIAL OF A BURIED TRANSISTOR GATE LINE AND METHOD OF FORMING A BURIED TRANSISTOR GATE LINE

TECHNICAL FIELD

Embodiments disclosed herein pertain to methods of forming conductive material of buried transistor gate lines and to methods of forming buried transistor gate lines.

BACKGROUND

Integrated circuitry may be fabricated over and within semiconductor substrates. Individual device components of the circuitry may be separated or electrically isolated from other components by dielectric or other isolation formed over and/or within the semiconductor substrate. One form of isolation is commonly referred to as trench isolation, wherein trenches are etched into semiconductor substrate material and subsequently filled with one or more dielectric materials. The trenches and isolation material therein may surround islands of semiconductor substrate material, commonly referred to as active area regions, where some of the individual circuit components are fabricated.

Integrated circuitry can be fabricated to have many functions, and may include many different electronic devices such as capacitors, transistors, resistors, diodes, etc. One type of transistor is a field effect transistor that has its gate construction received wholly or partially within a trench formed in semiconductor material of the active area regions. A gate insulator separates the conductive gate from the semiconductor material. A pair of source/drain regions is formed within semiconductor material elevationally higher than the conductive gate material. Application of suitable voltage to the conductive gate material within the trench enables current to flow through the semiconductor material between the source/drain regions along the trench sidewalls and around the base of the trench. The gates of buried transistors in some circuit constructions transversally cross some active area regions and extend between other immediately end-to-end adjacent active area regions.

A continuing goal in integrated circuitry fabrication is to form smaller individual components and to maximize circuit density by placing those components closer together. Accordingly, the trenches within which buried transistor gate lines are received are becoming narrower as are the lateral thicknesses of the gate insulator and conductive gate material within those trenches. Multiple different composition conductive materials are commonly used for the transistor gates to facilitate deposition, serve as diffusion barriers, and/or impart desired work-function. These different composition conductive materials typically have different respective electrical conductivity/resistivity. It is desirable to maximize volume of the higher conductive material(s) versus the lower conductive material(s) to maximize conductivity of the buried transistor gate lines, particularly as the overall volume of all conductive material of such gate lines decreases.

DETAILED DESCRIPTION OF EXAMPLE EMBODIMENTS

Figure 1:
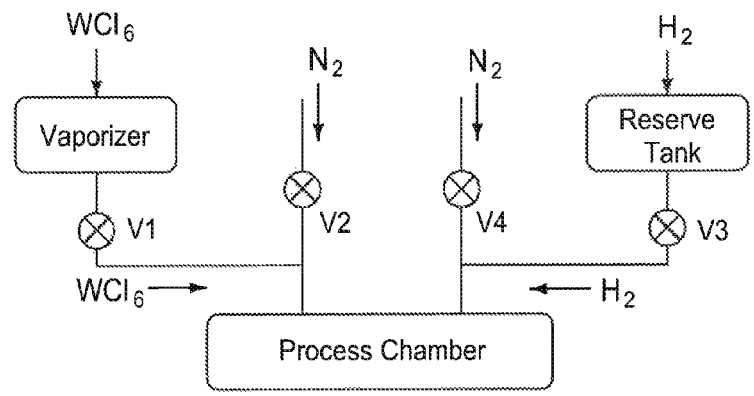
FIG. 1 is a diagrammatic schematic of an example system usable in accordance with an embodiment of the invention.

Embodiments of the invention encompass a method of forming conductive material of a buried transistor gate line. Such a method includes adhering a precursor comprising tungsten and chlorine to material within a substrate trench. In one embodiment, the adhered precursor is formed using $WCl_6$, and in one embodiment the adhered precursor comprises $WCl_x$ where "x" is less than 6. Another example adhered tungsten and chlorine-comprising precursor is $(C_5H_5)_2WCl_2$. Further, as an example, the adhered precursor may form a saturated or unsaturated monolayer deposited to within and laterally outward of the substrate trench and is deposited in an atomic layer deposition-like manner. Plasma or non-plasma deposition techniques (direct and/or remote) may be used, as may multiple time-spaced adhering steps using the same or different feed gas(es). Additionally, all of the adhered precursor may be of the same composition or of different compositions wherein at least some comprises tungsten and chlorine.

The substrate trench may be formed into a semiconductor substrate, and sidewalls and a base of the trench may at least initially comprise semiconductor material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The trench may be longitudinally elongated having a longitudinal contour and length of a desired buried transistor gate line that is being formed. The material within the trench to which the precursor is adhered may comprise a sidewall and/or a base of the trench, or may comprise material that is deposited/formed inside of the trench after its formation.

The adhered precursor is reduced with hydrogen to form elemental-form tungsten material over the material within the substrate from the adhered precursor. In the context of this document, "hydrogen" means molecular hydrogen ($H_2$) or a plasma derived from molecular hydrogen. In one embodiment, the stated acts of adhering the precursor followed by reducing it is conducted multiple times, for example to grow a layer of desired thickness where a single saturated or unsaturated monolayer may be of insufficient thickness for the buried transistor gate line being formed.

In one embodiment, the adhering and reducing forms the elemental-form tungsten material to comprise chlorine and in another embodiment to be devoid of chlorine. In the context of this document, "devoid of chlorine" means no more than $1 \times 10^{16}$ atoms/cm$^3$ of chlorine at least in that part of elemental-form tungsten that is formed using an adhered precursor comprising tungsten and chlorine. A material that comprises chlorine has more than $1 \times 10^{16}$ atoms/cm$^3$ of chlorine at least in that part of elemental-form tungsten that is formed using an adhered precursor comprising tungsten and chlorine. In one embodiment where the elemental-form tungsten material comprises chlorine, such is present at no greater than 0.4 atomic percent, where (for example) chlorine presence may be detrimental in a finished circuit construction encompassing a buried transistor gate line manufactured in accordance with embodiments of the invention.

FIG. 1 shows but one example system usable with methods in accordance with embodiments of the invention. Other systems, whether existing or yet-to-be developed, may of course be used. A substrate having a trench formed therein would reside within the depicted "Process Chamber". In this example, solid $WCl_6$ is vaporized by a "Vaporizer" and $H_2$ resides in a "Reserve Tank". Inert gas lines (e.g., inert gas $N_2$) provide reactant transport and reactant purging. Flow control of the subject gasses may be controlled via the depicted valves V1, V2, V3, and V4. Plasma may be generated within the "Process Chamber" (e.g., direct plasma) and/or using remotely-generated plasma with respect to one or more of the depicted gas feed lines, or no plasma may be used.

Figure 2:
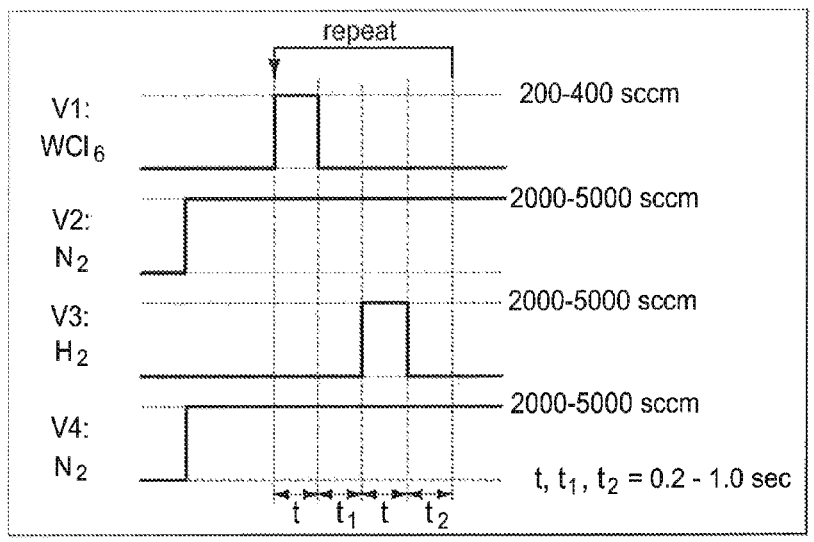
FIG. 2 is a diagram of an example gas flow sequence usable in accordance with an embodiment of the invention.

FIG. 2 shows example flow rates of gas through the depicted valves of a system like that in FIG. 1 usable in accordance with embodiments of the invention. By way of example only, FIG. 2 shows $N_2$ used as both a transport gas for the reactants and as a purge gas, and as constantly flowing during processing. An example temperature range for a susceptor upon which a substrate rests within the Process Chamber is about 400° C. to about 500° C. An example pressure range within the Process Chamber during the acts of adhering and reducing is from about 10 Torr to about 50 Torr.

Figures 3, 4:
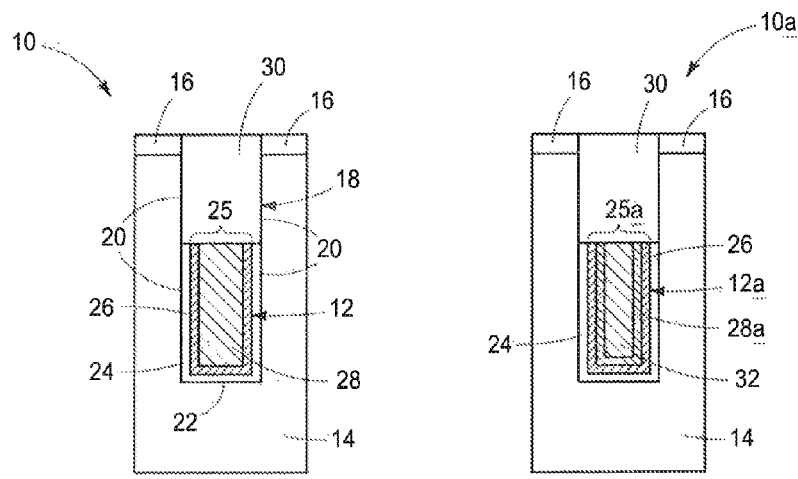
FIG. 3 is a diagrammatic sectional view of a buried transistor gate line manufactured in accordance with an embodiment of the invention.
FIG. 4 is a diagrammatic sectional view of a buried transistor gate line manufactured in accordance with an embodiment of the invention.

FIG. 3 depicts a substrate fragment 10 within which a buried transistor gate line 12 has been formed in accordance with a method embodiment of the invention. Buried transistor gate line 12 may be longitudinally elongated, for example running into and out of the plane of the page upon which FIG. 3 lies in straight, curvilinear, and/or other manners. Materials may be aside, elevationally inward, or elevationally outward of the FIG. 3-depicted materials. For example, other partially or wholly fabricated components of integrated circuitry may be provided somewhere about or within substrate 10. Further, such substrate may comprise any one or more of conductive (i.e., electrically herein), semiconductive, or insulative/insulator (i.e., electrically herein) material(s). Regardless, any of the materials, regions, and structures described herein may be homogenous or non-homogenous, and regardless may be continuous or discontinuous over any material which such overlie. Further, unless otherwise indicated, each material may be formed using any suitable or yet-to-be-developed technique, with atomic layer deposition, chemical vapor deposition, physical vapor deposition, epitaxial growth, diffusion doping, and ion implanting being examples.

Substrate 10 comprises semiconductor material 14 (e.g., suitably doped monocrystalline silicon) having dielectric material 16 (e.g., $Si_3N_4$ and/or $SiO_2$) there-over. A trench 18 has been formed within substrate 10. Trench 18 may be considered as having sidewalls 20 and a base 22. For convenience and clarity in the drawings, sidewalls 20 are shown to be vertically straight-linear and base 22 is shown to be horizontally straight-linear. However, the trench sidewalls more likely in reality will taper laterally inward (not shown) and base 22 will be rounded or arcuate (not shown). Further, sharp corners are shown although such will likely be rounded in actual construction. Regardless, other configurations may be used.

A gate insulator material 24 (e.g., $SiO_2$, $Si_3N_4$, and/or hi-k dielectric) has been formed along at least some of trench sidewalls 20 and trench base 22. As an example, trench 18 in another vertical section than that depicted by FIG. 3 may extend through dielectric isolation material within which gate insulator material 24 may not be formed. An example thickness for gate insulator is about 10 Angstroms to 30 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated.

Buried transistor gate line 12 comprises conductive gate material 25. In one embodiment and as shown, such comprises conductive material 26 deposited over, and in one embodiment directly against, gate insulator 24. In this document, a material, region, or structure is "directly against" another when there is at least some physical touching contact of the stated materials, regions, or structures relative one another. In contrast, "over", "on", and "against" not preceded by "directly" encompass "directly against" as well as construction where intervening material(s), region(s), or structure(s) result(s) in no physical touching contact of the stated materials, regions, or structures relative one another. An example conductive gate material 26 is TiN deposited to a thickness of about 20 Angstroms. Conductive gate material 26 may be included, for example, to provide a diffusion barrier function and/or to establish a desired work-function of the buried transistor gate line being formed. Alternate conductive materials 26 may be used, with any conductive material referred to herein (unless otherwise expressly limited) comprising any one or more of an elemental metal, an alloy or mixture of elemental metals, conductively doped semiconductive material, and conductive metal compounds.

Conductive gate material 25 also comprises elemental-form tungsten material 28. Such is formed by adhering a precursor comprising tungsten and chlorine over material within trench 18 followed by reducing the precursor with hydrogen to form elemental-form tungsten material 28 within trench 18 from the precursor, for example as described above.

Gate insulator material 24 and conductive material 26 as initially formed may extend elevationally outward of trench 18 and across dielectric material 16. In one embodiment, a method of forming the buried transistor gate line comprises repeating (i.e., iterating) the adhering and reducing to overfill remaining volume of trench 18. Then, uppermost portions of the gate insulator material 24 and conductive gate material 25 may be removed (e.g., by selective etching) to recess them within trench 18, for example to the outermost elevation of such materials in trench 18 as shown. A suitable dielectric 30 (e.g., $SiO_2$ and/or $Si_3N_4$) may then be deposited to fill remaining volume of trench 18 and planarized back, for example as shown.

Such provides but one example method of forming a buried transistor gate line 12 in accordance with an embodiment of the invention. Such also provides but one example method of forming conductive material 25 of a buried transistor gate line 12 in accordance with an embodiment of the invention. In one embodiment and as shown, the precursor is adhered directly against the material within substrate trench 18 that at least initially is TiN. For example, one or more of a pair of adhering and reducing steps is/are used to form an initial saturated or unsaturated monolayer of elemental-form tungsten material 28 that is directly against example TiN material 26. In one embodiment and regardless of presence of material 26, where the adhering and reducing are repeated multiple times, subsequent precursor will be adhered within the trench directly against elemental-form tungsten which was previously formed using the stated adhering and reducing steps.

Alternate example methods of forming conductive material of a buried transistor gate line, and of forming a buried transistor gate line, are next described with reference to FIG. 4 with respect to a substrate fragment 10a. Like numerals from the above-described embodiments have been used where appropriate, with some construction differences being indicated with the suffix "a" or with different numerals. In FIG. 4, elemental-form tungsten material 28a of conductive material 25a is formed by adhering and reducing the precursor to not overfill remaining volume of trench 18, thereby forming material 28a as a lining within trench 18 (e.g., about 20 to 120 Angstroms thick). Nevertheless, the stated acts of adhering and reducing the precursor may occur multiple times in the formation of the desired lining of material 28a. Regardless, elemental-form tungsten material 32 has been formed within substrate trench 18 using $WF_6$ at some point after reducing the adhered precursor and to overfill remaining volume of trench 18 with elemental-form tungsten 32. Uppermost portions of gate insulator 24 and conductive gate material 25a may then be removed to recess them within trench 18, for example to the outermost elevation of such materials in trench 18 as shown. Elemental-form tungsten 32 may be deposited using chemical vapor deposition and/or atomic layer deposition techniques, and regardless may contain F. Materials 32 and 28a may be of the same chemical composition (e.g., consisting essentially of elemental-form tungsten) but for presence of any chlorine atoms and/or fluorine atoms. A method conducted to produce a structure in accordance with FIG. 4 as opposed to that of FIG. 3 may be desired where, for example, elemental-form tungsten 32 is deposited using chemical vapor deposition which reduces production time in comparison to using solely atomic layer deposition-like methods.

A predecessor technology to that of the invention deposits an elemental-form tungsten nucleation layer by atomic layer deposition to a thickness about 30 to 50 Angstroms directly against TiN using $WF_6$ for adhered precursor-formation and $SiH_4$ or $B_2H_6$ as a reducing agent. Thereafter, remaining volume of the trench is filled by chemical vapor deposition using $WF_6$. The elemental-form tungsten nucleation layer formed in such manner has considerably higher electrical resistivity than that of the tungsten subsequently deposited by chemical vapor deposition using $WF_6$, and thus reduces overall conductivity of the buried transistor gate line. In one embodiment in accordance with the invention, the method is devoid of using each of $SiH_4$ and $B_2H_6$ in forming all of the conductive material of the buried transistor gate line that is within the substrate trench. Regardless, in one embodiment, the method comprises forming all of the conductive material of the buried transistor gate line that is within the trench to be devoid of each of silicon and boron. In the context of this document, "devoid of each of silicon and boron" means no more than $1 \times 10^{16}$ atoms/cm$^3$ of each of Si and B at least in that part of the elemental-form tungsten that is formed using an adhered precursor comprising tungsten and chlorine.

Figure 5:
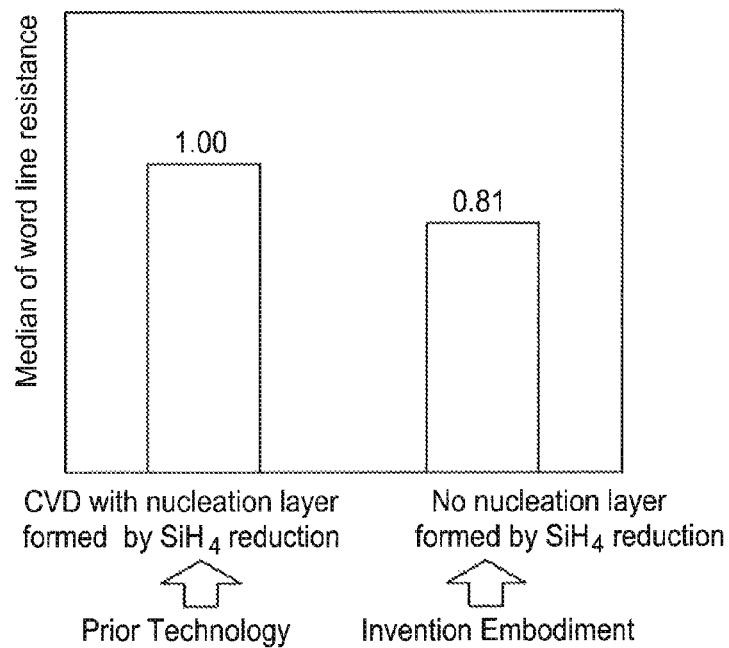
FIG. 5 is a graphical representation of electrical resistances of a buried transistor gate line manufactured in accordance with a predecessor process and one manufactured in accordance with an embodiment of the invention.
Figure 6:
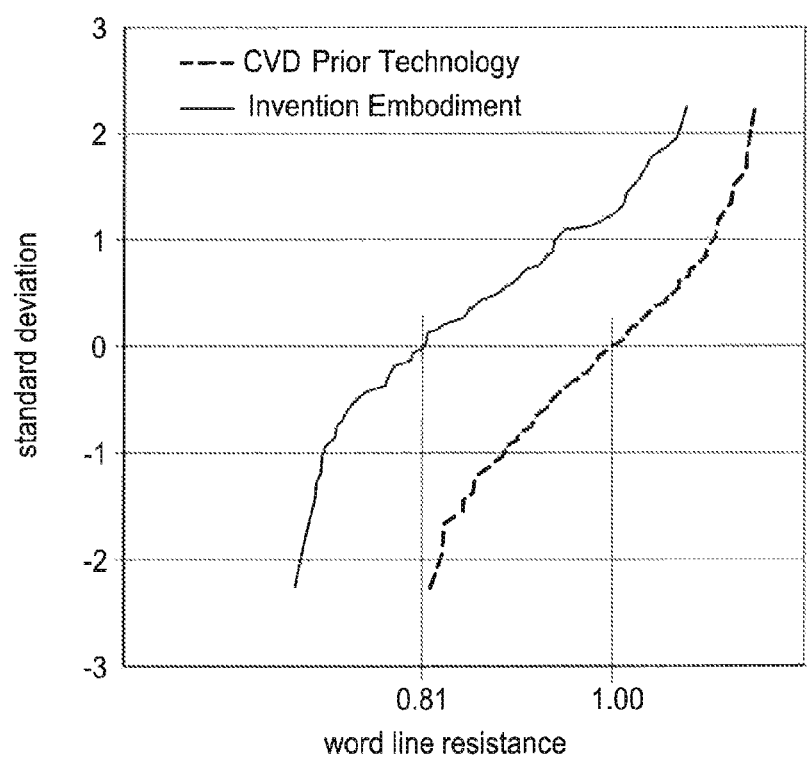
FIG. 6 is a graphical representation of distribution of electrical resistances of a buried transistor gate line manufactured in accordance with a predecessor process and one manufactured in accordance with an embodiment of the invention.

FIGS. 5 and 6 compare achieved electrical resistances of a buried transistor gate line manufactured in accordance with prior technology to that manufactured in accordance with an embodiment of the invention. Each of the buried transistor gate line structures of the "Prior Technology" and "Invention Embodiment" had an open trench top-width of about 210 Angstroms. The Prior Technology gate line contained 20 Angstroms of atomic layer deposited TiN, an elemental-form tungsten nucleation layer of 30 Angstroms formed by atomic layer deposition using $WF_6$ and $SiH_4$, with the remaining volume of elemental-form tungsten being deposited by chemical vapor deposition using $WF_6$ and $H_2$. The top width of the chemical vapor deposited elemental-form tungsten was about 110 Angstroms. The Invention Embodiment buried gate line included 20 Angstroms of atomic layer deposited TiN, with the remaining volume (material 28) of conductive material 25 deposited as shown and described above with respect to FIG. 3 using $WCl_6$ to adhere the precursor, followed by reduction with $H_2$. Such produced an elemental-form tungsten material within the trenches individually having a top width of about 17 nm. Comparing the two bars in FIG. 5, a reduction in electrical resistivity of about 19% (a normalized 0.81 of the Invention Embodiment in comparison to a normalized 1.00 of the Prior Technology) was achieved. FIG. 6 is a graph of standard deviation versus buried transistor gate line electrical resistance over seventy-eight different locations along the respective buried transistor gate lines of the respective substrates.

Embodiments of the invention encompass forming the buried transistor gate line to be part of memory integrated circuitry. For example, and by way of example only, the buried transistor gate line may comprise an access/word line of memory circuitry. An individual transistor incorporating such access/word line may have one of its source/drain regions electrically coupled with a charge storage device (e.g., a capacitor) while another source/drain region of such transistor could be connected with a sense/bit line. Other memory integrated circuitry constructions may be used.

Figure 7:
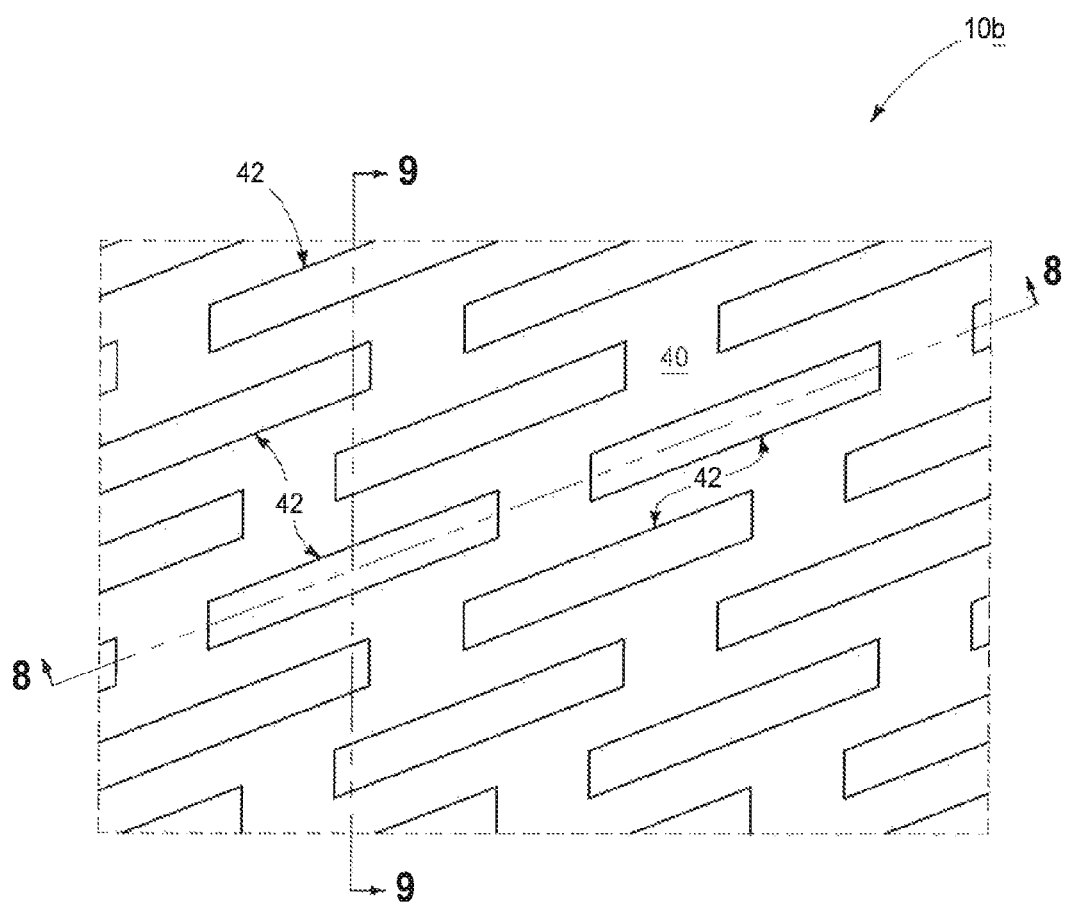
FIG. 7 is a diagrammatic top plan view of a substrate fragment in process in accordance with an embodiment of the invention.
Figure 8:
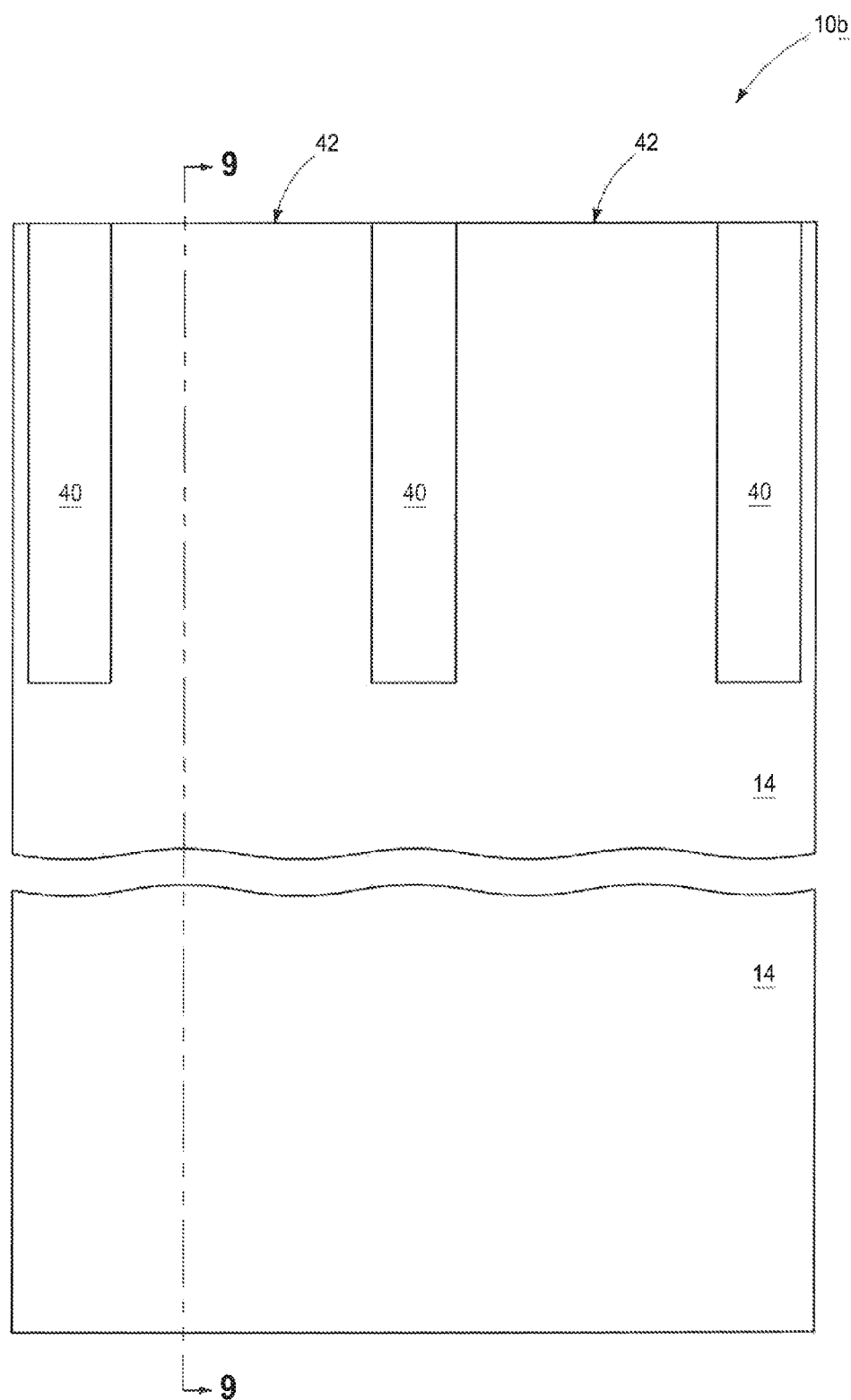
FIG. 8 is a diagrammatic sectional view taken through lines 8-8 in FIGS. 7 and 9.
Figure 9:
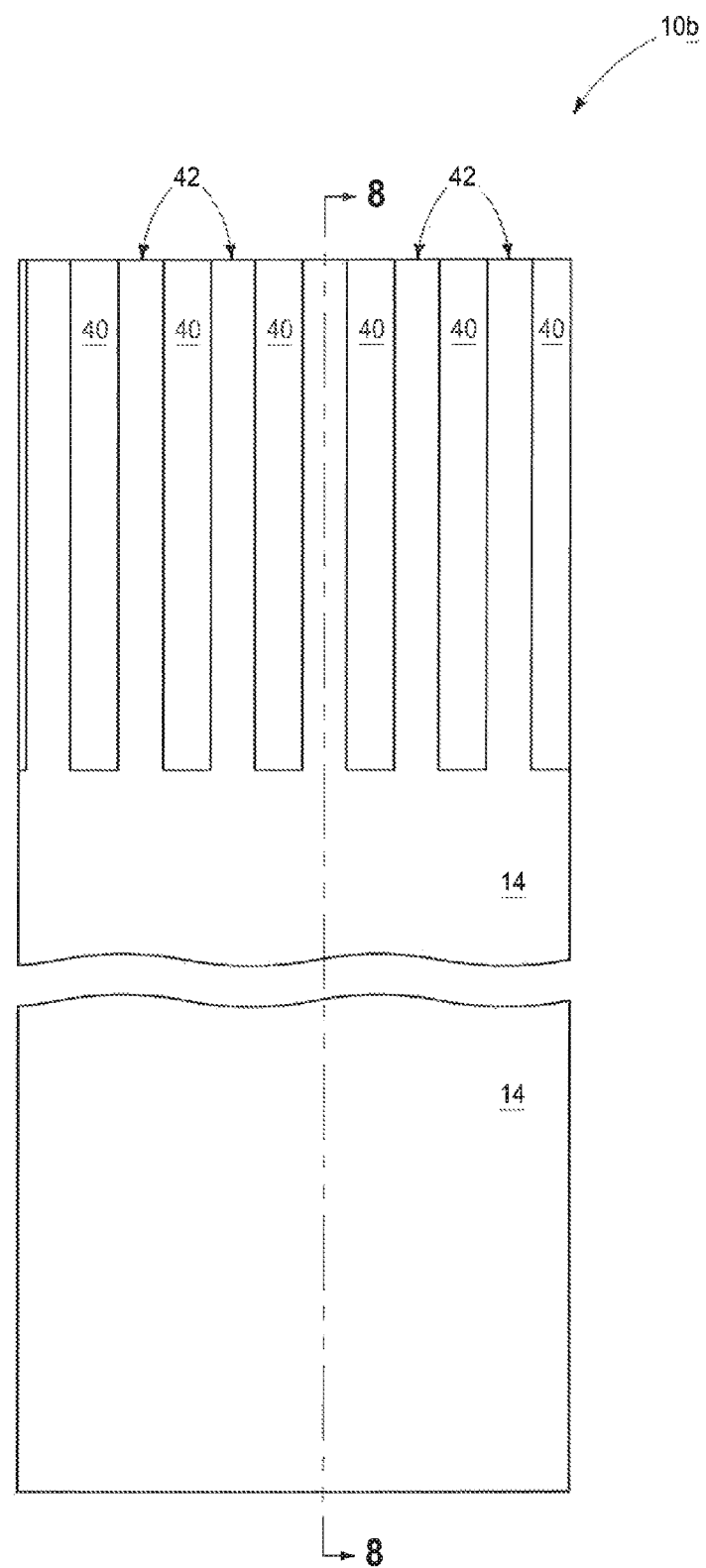
FIG. 9 is a diagrammatic sectional view taken through lines 9-9 in FIGS. 7 and 8.

More specific examples of a method of forming conductive material of a buried transistor gate line and of a method of forming a buried transistor gate line are described with reference to FIGS. 7-27 for fabrication of constructions as shown in FIG. 3. Analogous processing could be conducted to form constructions as shown in FIG. 4, as the artisan will readily appreciate. Referring to FIGS. 7-9, a portion of a memory array of a substrate 10b is shown. Like numerals from the above-described embodiments have been used where appropriate, with some construction differences being indicated with the suffix "b" or with different numerals. Trench isolation 40 (e.g., $Si_3N_4$ and/or $SiO_2$) has been formed relative to semiconductor material 14 (e.g., lightly p-doped monocrystalline silicon) defining active area islands 42. Although bulk semiconductor substrate processing is shown, semiconductor-on-insulator substrate and/or other processing may be used.

Figure 10:
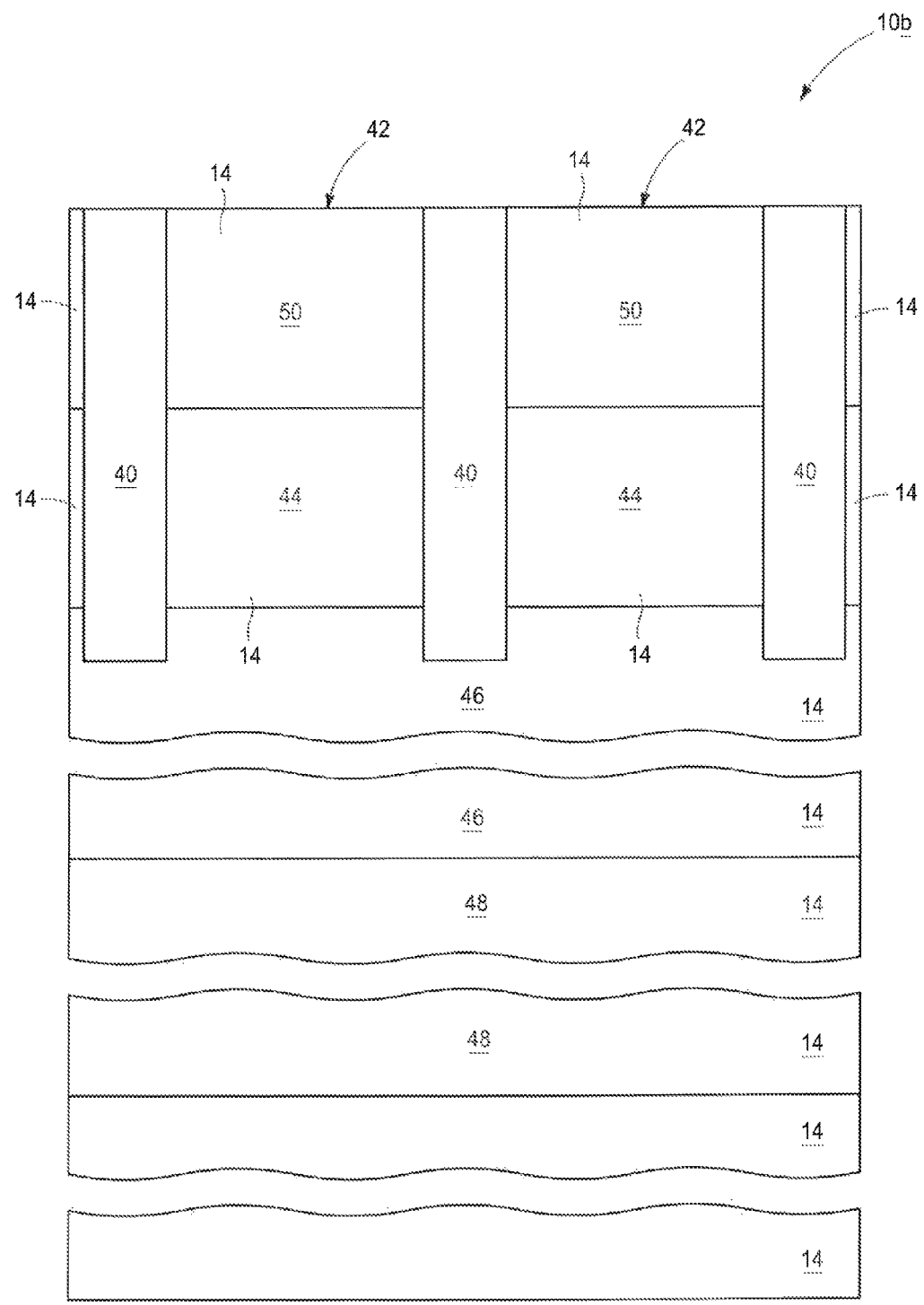
FIG. 10 is a view of the FIG. 8 substrate at a processing step subsequent to that shown by FIG. 8.

Referring to FIG. 10, various p-type and n-type implants have been conducted. For example, a p-type boron-implanted region 44 may be provided to control a threshold voltage of a field effect transistor incorporating a buried transistor gate line manufactured in accordance with the invention. Another boron-implant may be conducted to form a p-well region 46, and which is distributed below p-type implant region 44. Phosphorous may be implanted to form an n-lightly doped drain region 50 near an upper surface of active areas 42. Depth of implant region 50 may be shallower than that of trench isolation material 40. P-well region 46 may cover bottoms of trench isolation material 40 and have peak boron concentration near the bottom of trench isolation 40, with p-type implant region 44 being distributed between n-lightly doped drain region 50 and p-well region 46. A thermal treatment may be used to activate the implanted dopants/species.

Figure 11:
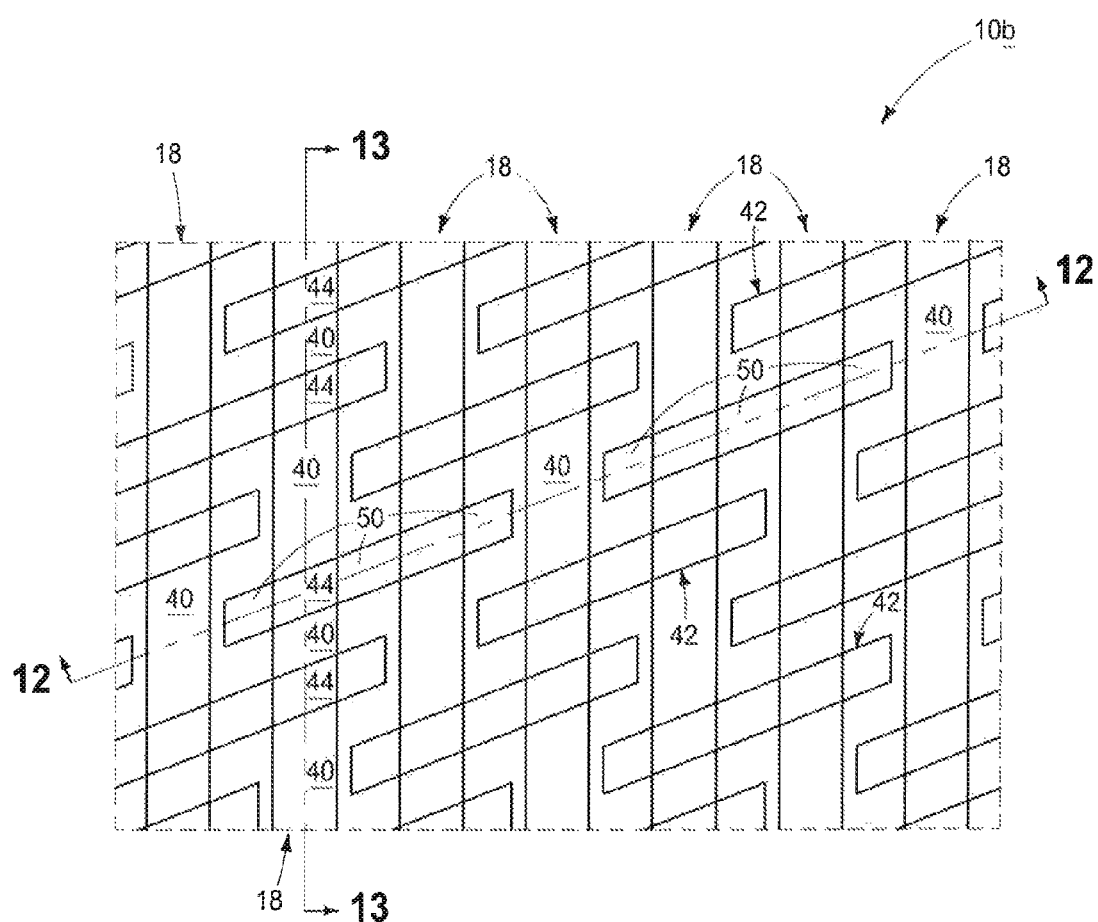
FIG. 11 is a diagrammatic sectional view of the FIG. 7 substrate at a processing step subsequent to that shown by FIG. 10, and taken through line 11-11 in FIG. 12.
Figure 12:
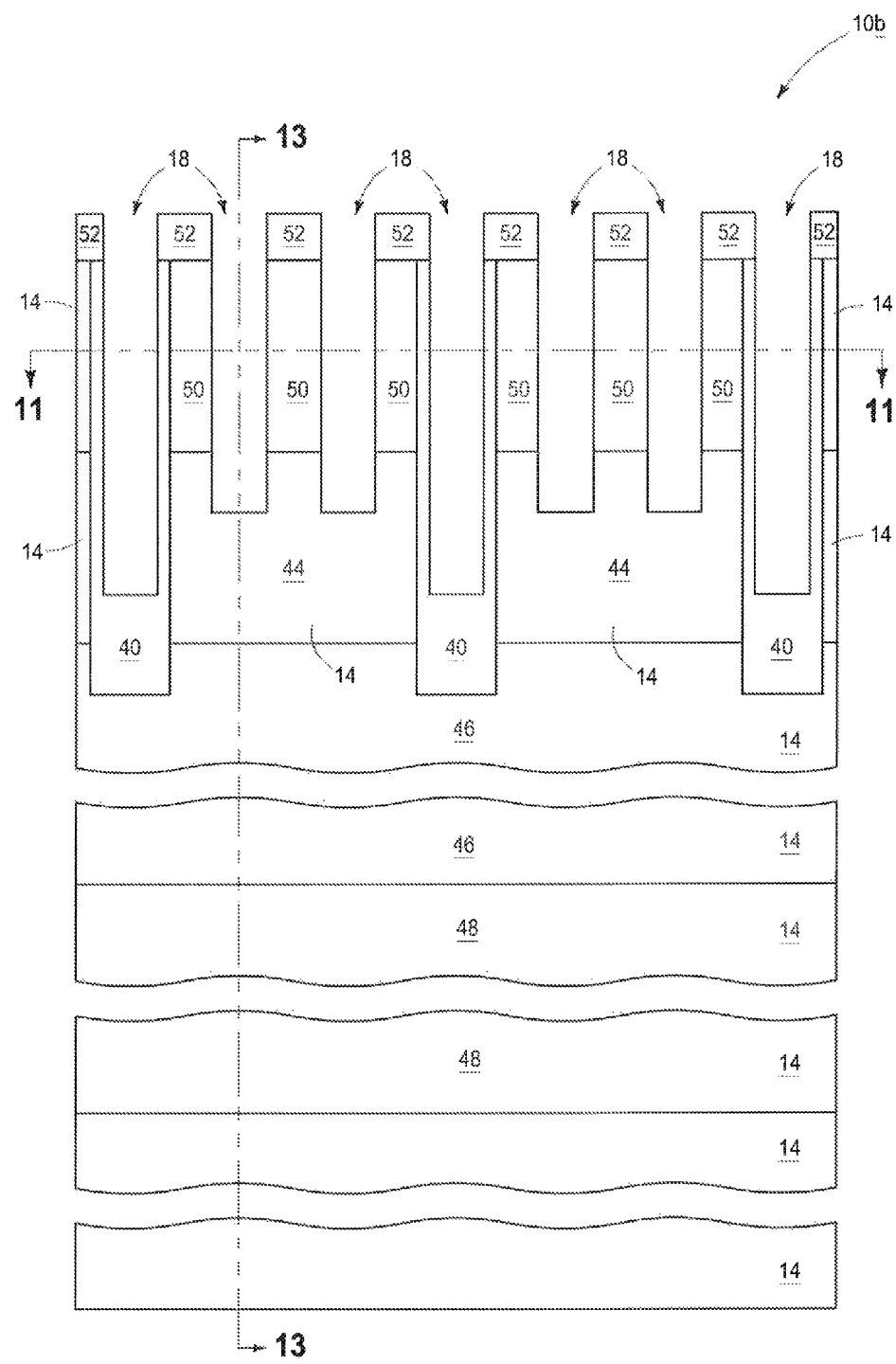
FIG. 12 is a diagrammatic sectional view taken through lines 12-12 in FIGS. 11 and 13.
Figure 13:
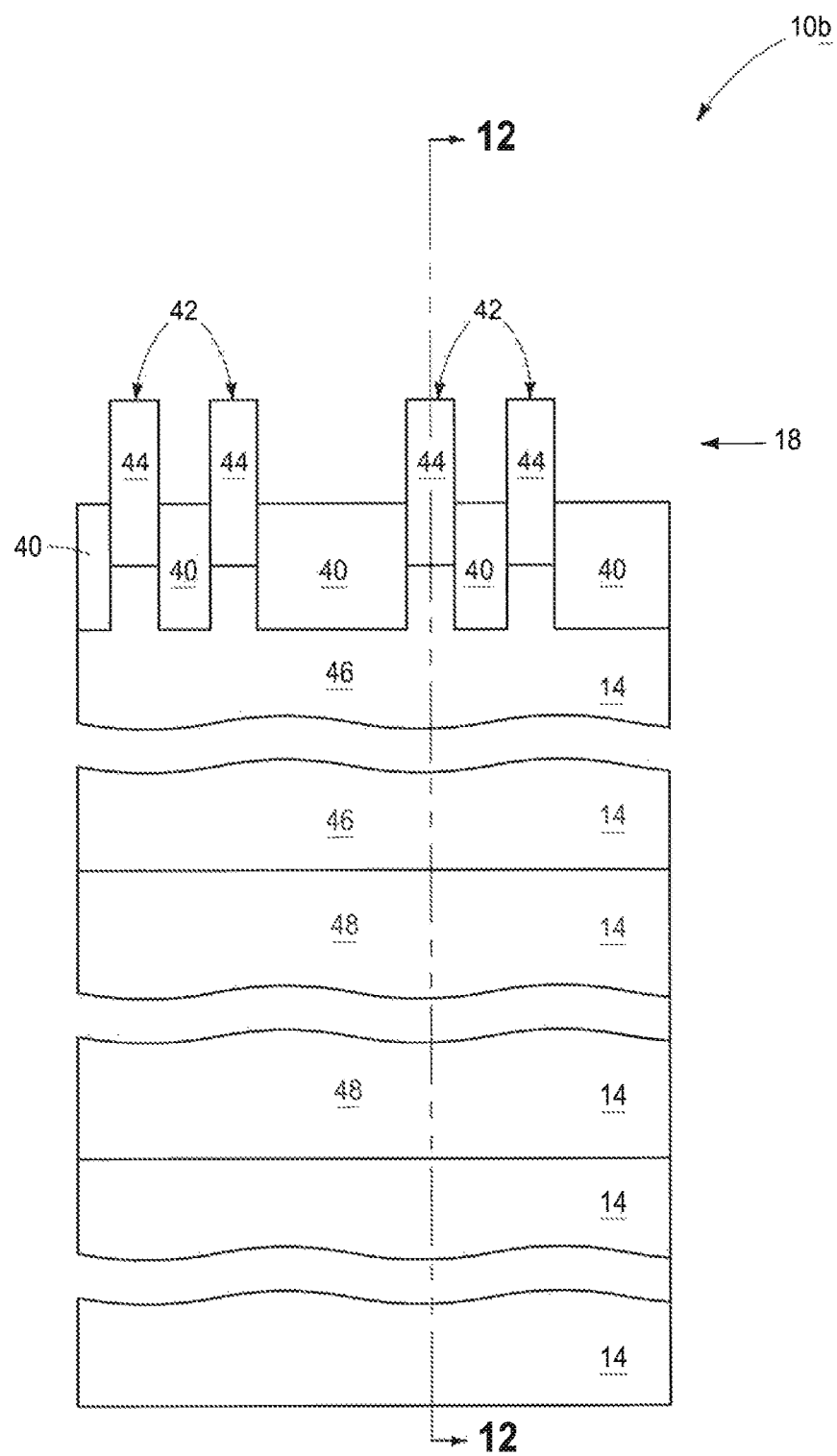
FIG. 13 is a diagrammatic sectional view taken through lines 13-13 in FIGS. 11 and 12.

Referring to FIGS. 11-13, dielectric material 52 (e.g., $SiO_2$) has been formed as part of substrate 10b and substrate trenches 18 have been formed, for example by etching simultaneously into semiconductor material 14 and trench isolation 40, with each trench extending longitudinally through individual active areas 42 and trench isolation 40. An example depth of each trench 18 is shallower than that of trench isolation 40 and deeper than that of n-lightly doped drain regions 50.

Figure 14:
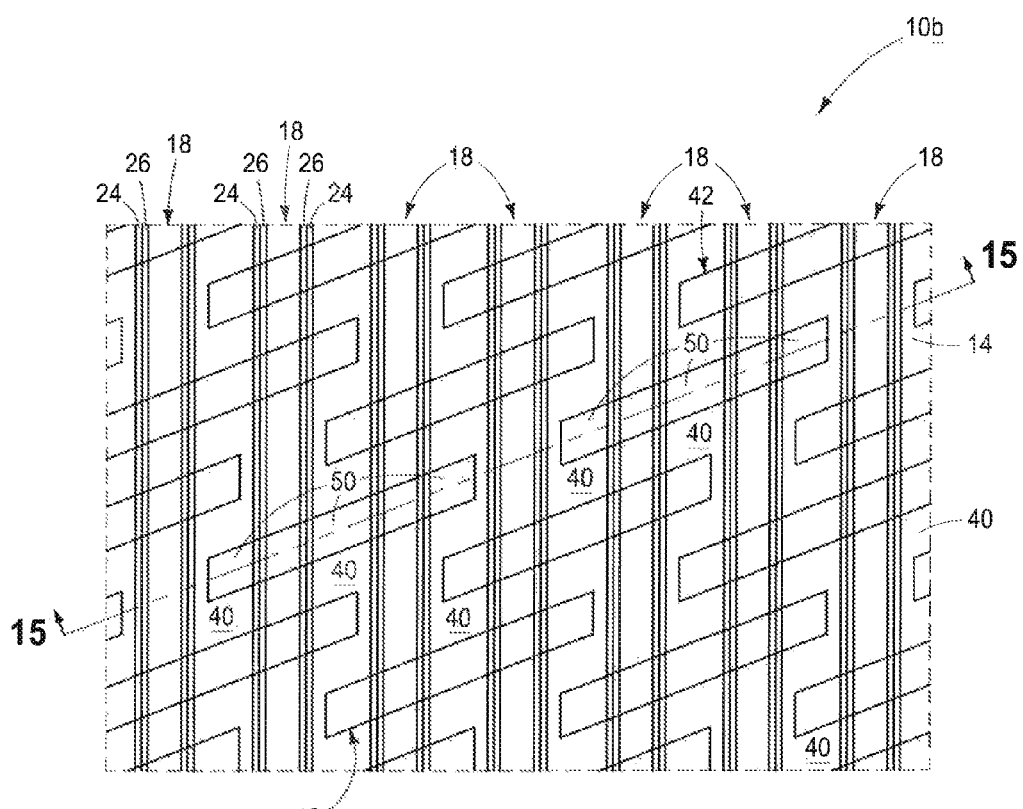
FIG. 14 is a view of the FIG. 11 substrate at a processing step subsequent to that shown by FIG. 11, and taken through line 14-14 in FIG. 15.
Figure 15:
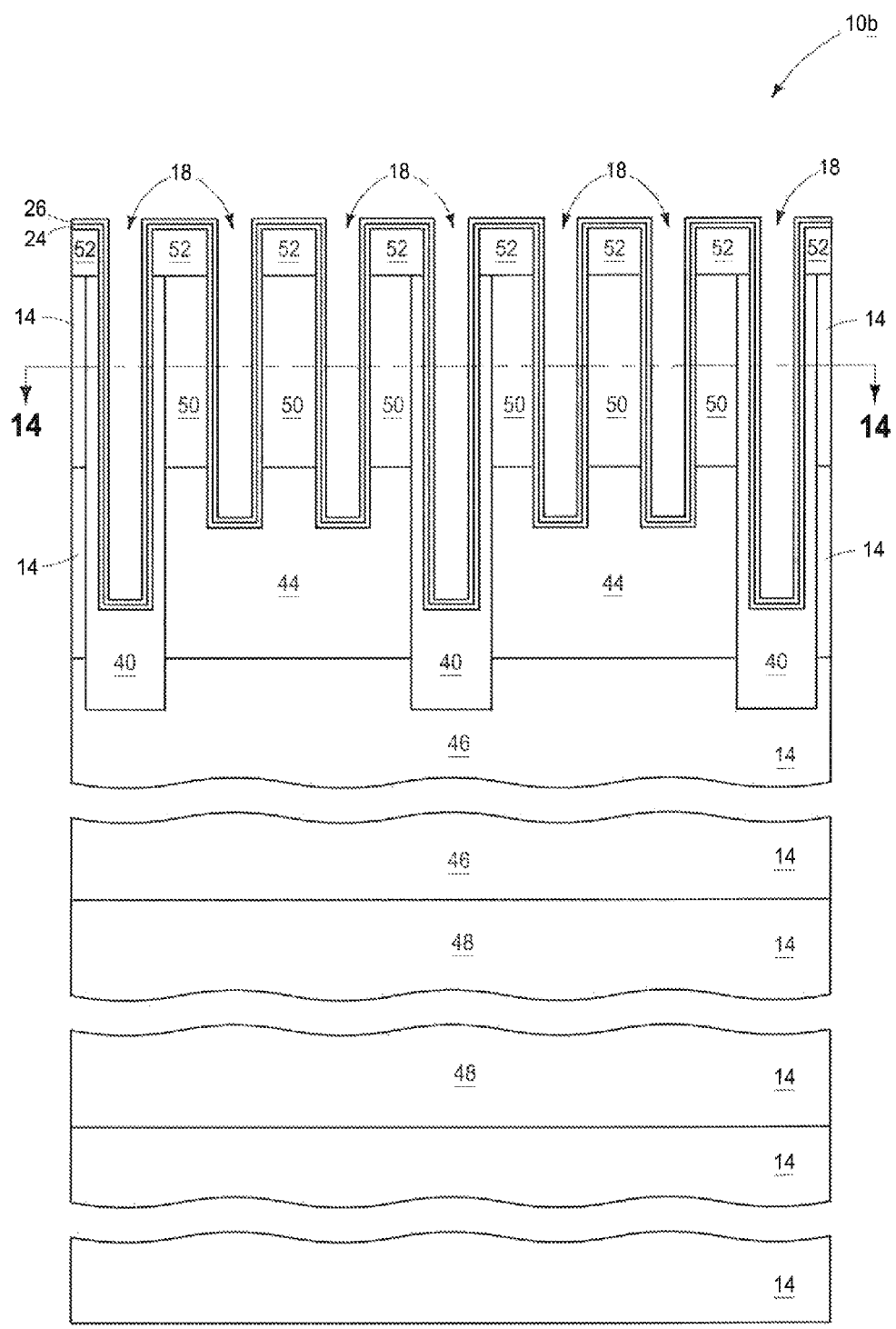
FIG. 15 is a diagrammatic sectional view taken through line 15-15 in FIG. 14.

Referring to FIGS. 14 and 15, gate insulator material 24 and conductive material 26 have been formed to line trenches 18.

Figure 16:
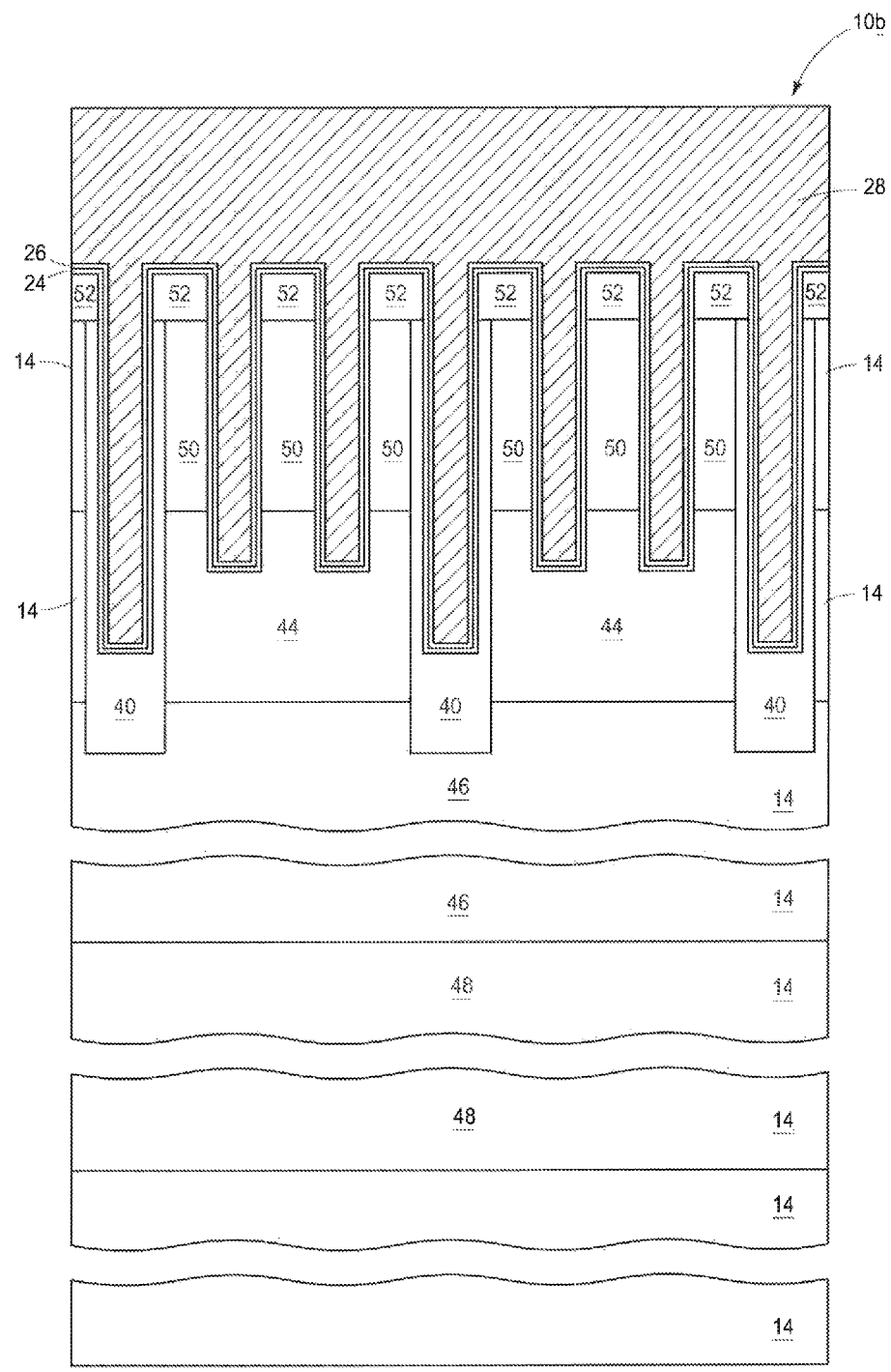
FIG. 16 is a view of the FIG. 15 substrate at a processing step subsequent to that shown by FIG. 15.

Referring to FIG. 16, elemental-form tungsten material 28 has been formed by adhering a precursor comprising tungsten and chlorine to material within substrate trenches 18 and reducing of such precursor with hydrogen, as described above.

Figure 17:
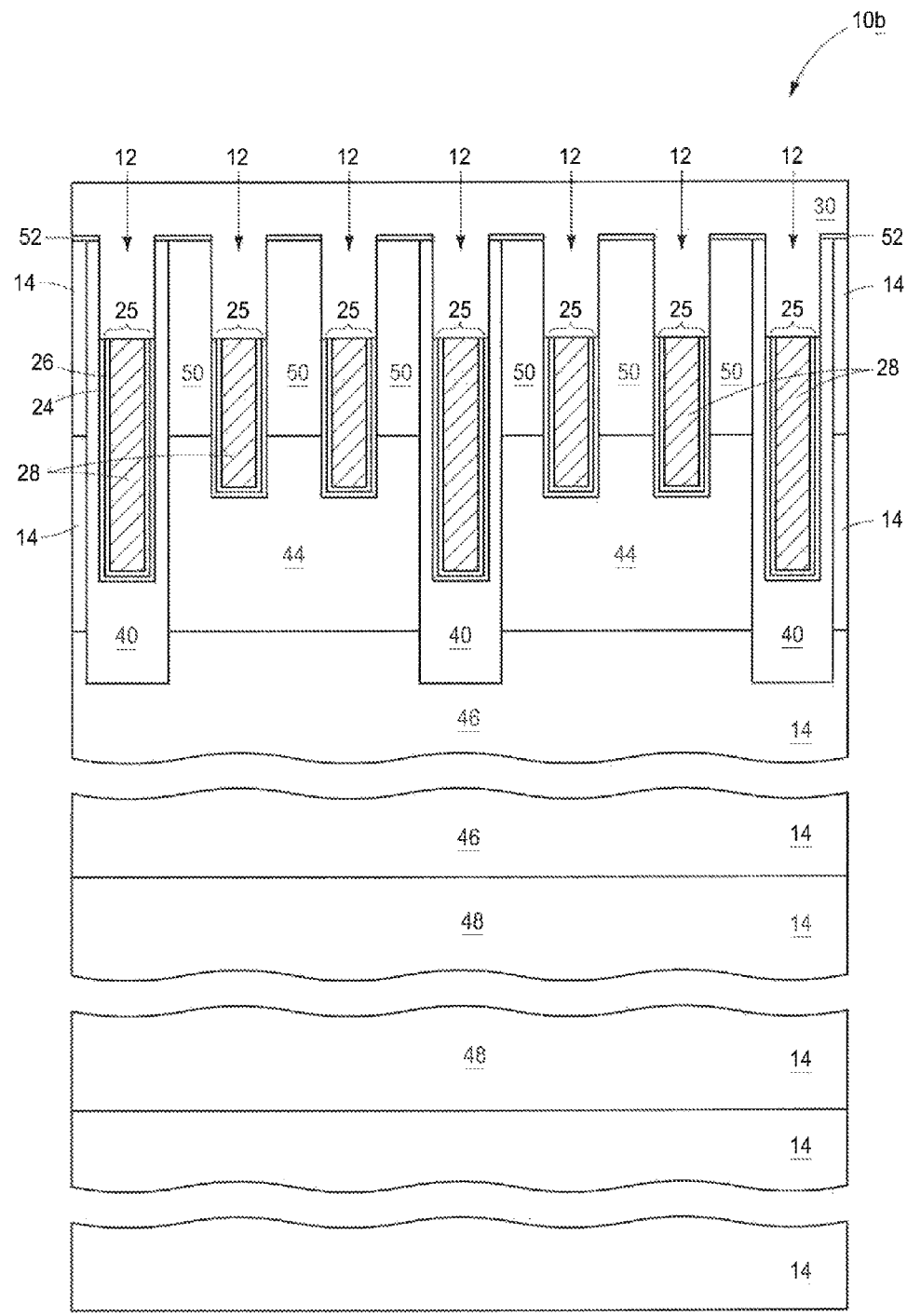
FIG. 17 is a view of the FIG. 16 substrate at a processing step subsequent to that shown by FIG. 16.

Referring to FIG. 17, materials 24, 26, and 28 have been recessed into trenches 18 to a depth shallower than a bottom of n-lightly doped drain regions 50. Dielectric material 52 is also shown as at least having been partially removed in the process. Capping dielectric layer 30 has been subsequently deposited. Buried transistor gate lines 12 comprising conductive gate material 25 have thereby been formed.

Figure 18:
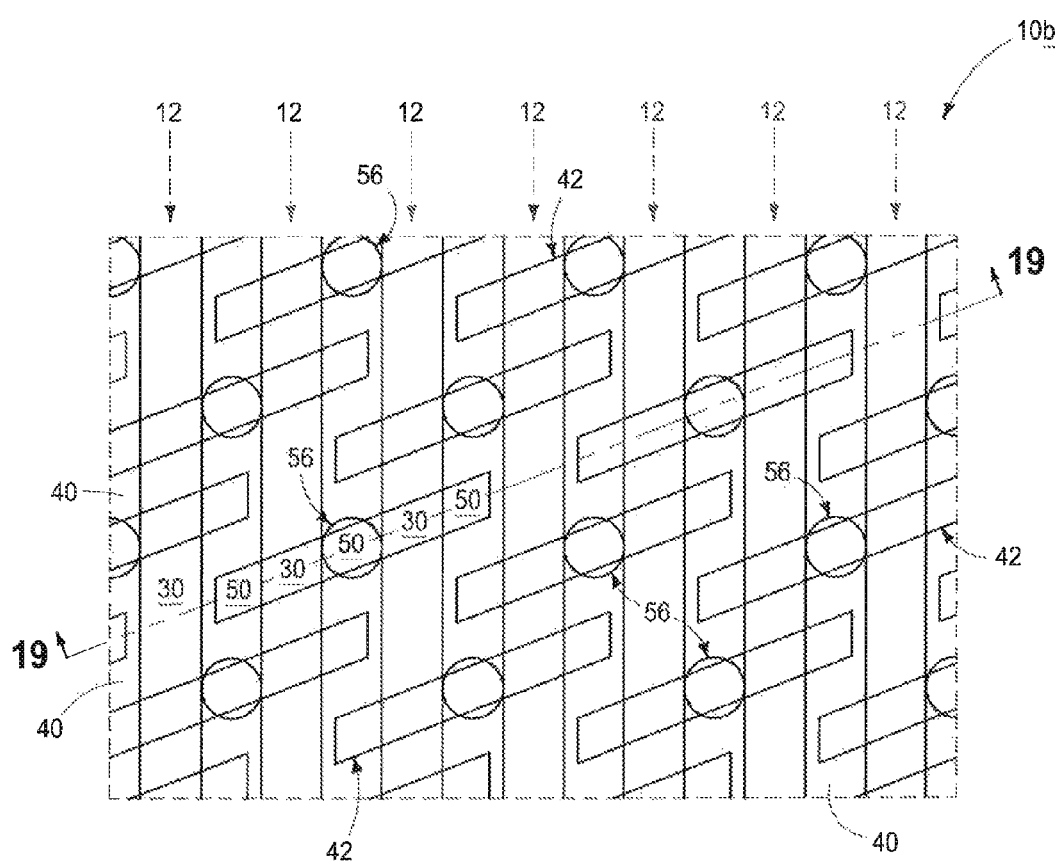
FIG. 18 is a view of the FIG. 14 substrate at a processing step subsequent to that shown by FIG. 17, and taken through line 18-18 in FIG. 19.
Figure 19:
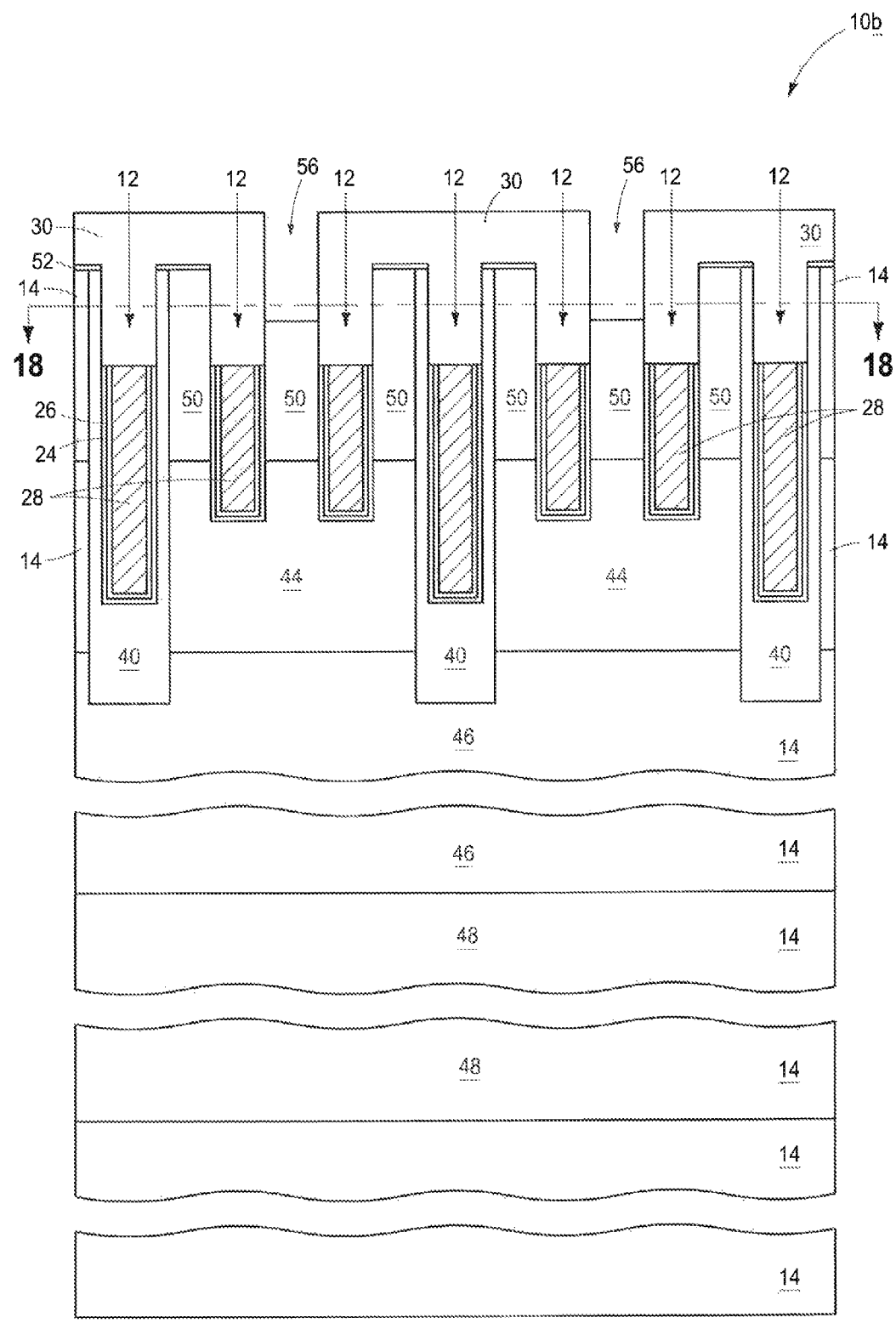
FIG. 19 is a diagrammatic sectional view taken through line 19-19 in FIG. 18.

Referring to FIGS. 18 and 19, contact openings 56 have been formed to extend through capping dielectric 30 to expose n-lightly doped drain regions 50 in active areas 42 between buried transistor gate lines 12.

Figure 20:
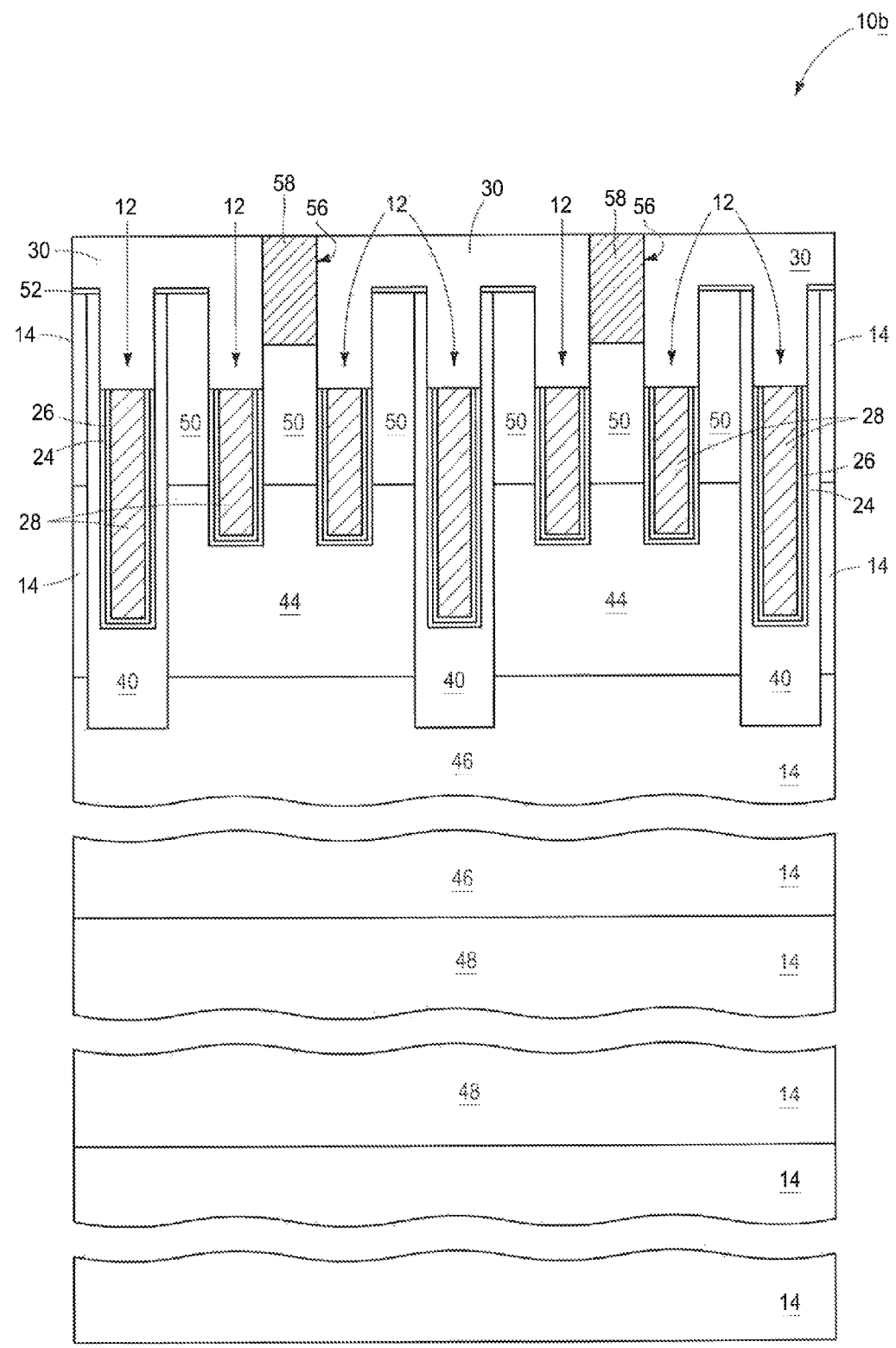
FIG. 20 is a view of the FIG. 19 substrate at a processing step subsequent to that shown by FIG. 19.
Figure 21:
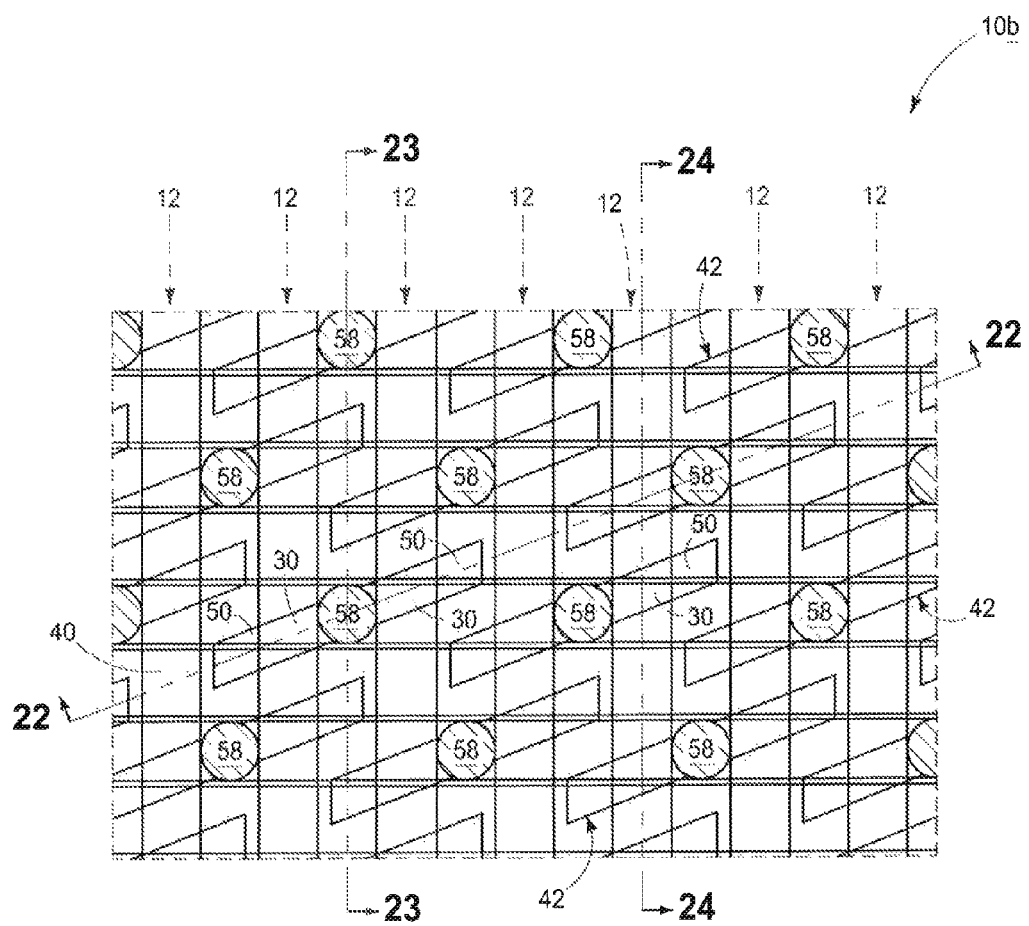
FIG. 21 is a view of the FIG. 18 substrate at a processing step subsequent to that shown by FIG. 20, and taken through lines 21-21 in FIGS. 22 and 23.
Figure 22:
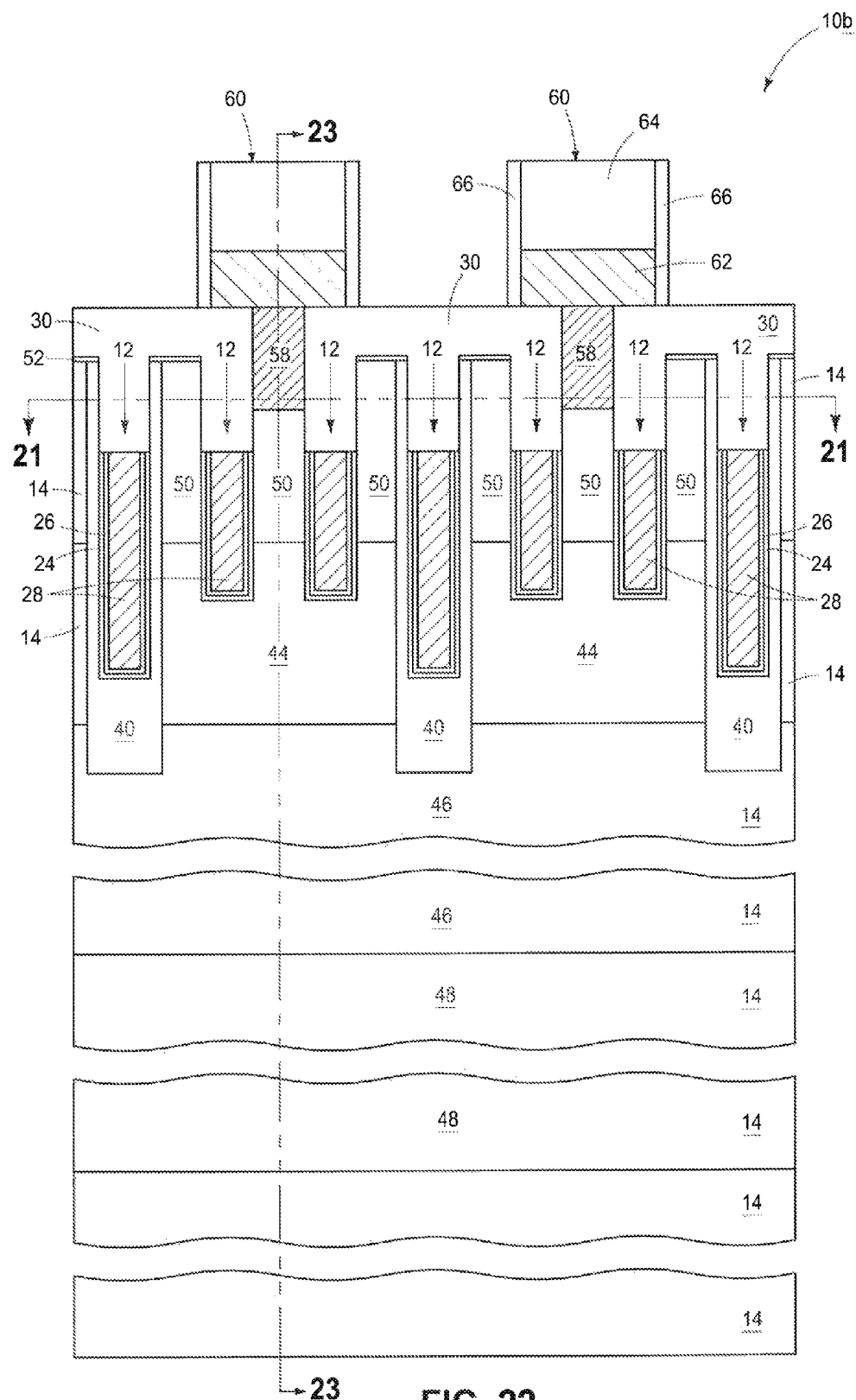
FIG. 22 is a diagrammatic sectional view taken through lines 22-22 in FIGS. 21, 23, and 24.
Figure 23:
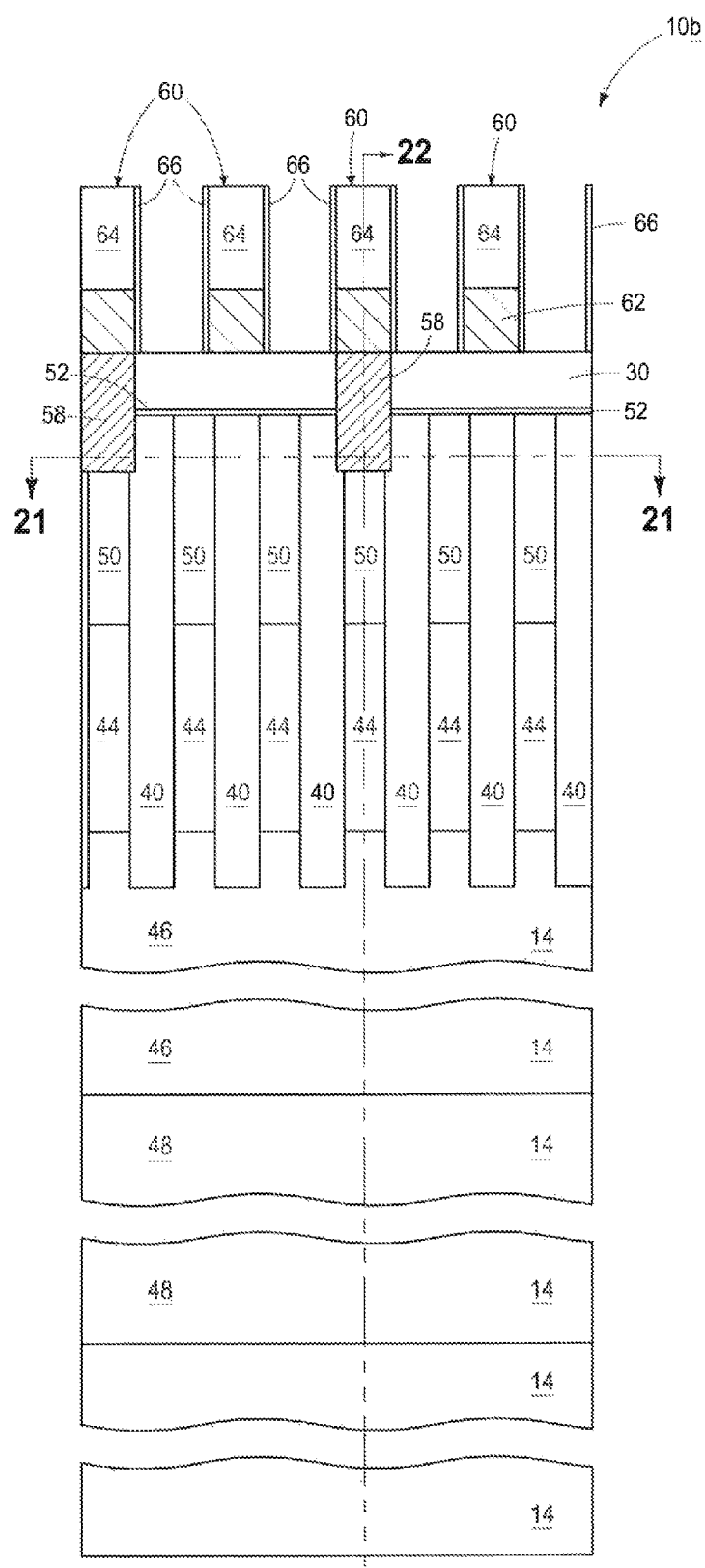
FIG. 23 is a diagrammatic sectional view taken through lines 23-23 in FIGS. 21 and 22.

Referring to FIG. 20, contact openings 56 have been plugged with conductive material 58, for example to overfill such contact openings followed by polishing thereof back at least to an elevationally outermost surface of capping dielectric material 30.

Figure 24:
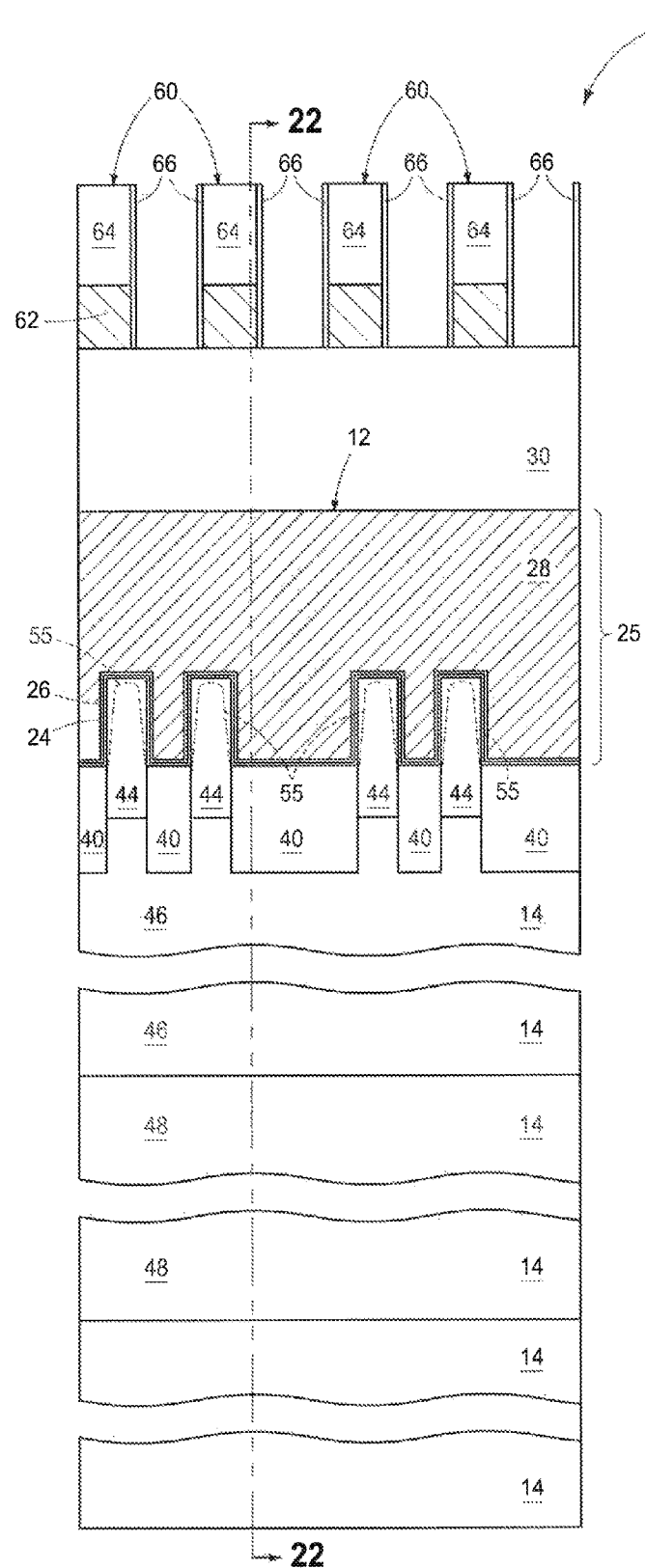
FIG. 24 is a diagrammatic sectional view taken through line 24-24 in FIG. 21.
Figure 25:
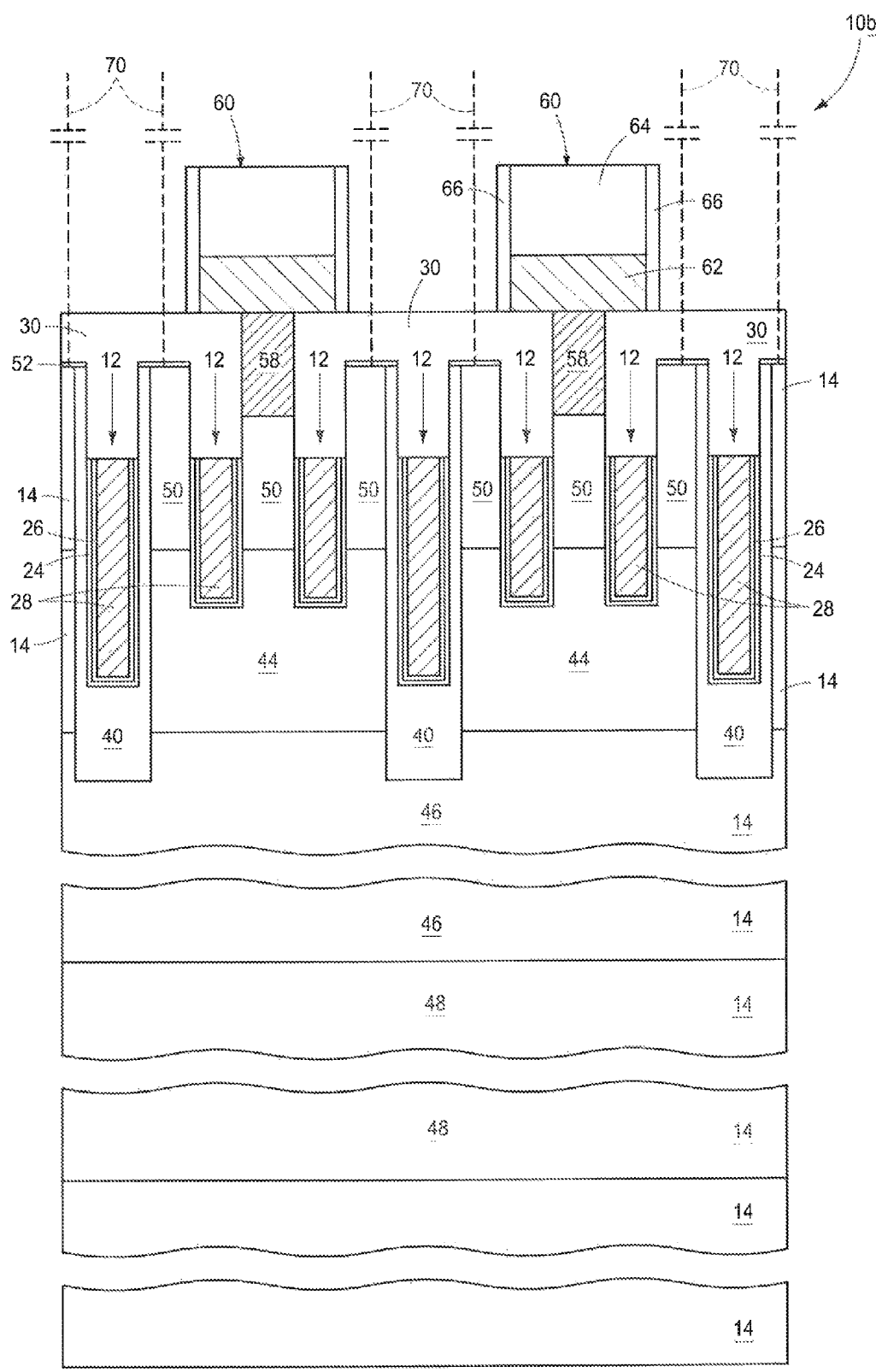
FIG. 25 is a hybrid schematic and structure view of the FIG. 22 substrate at a processing step subsequent to that shown by FIG. 22.
Figure 26:
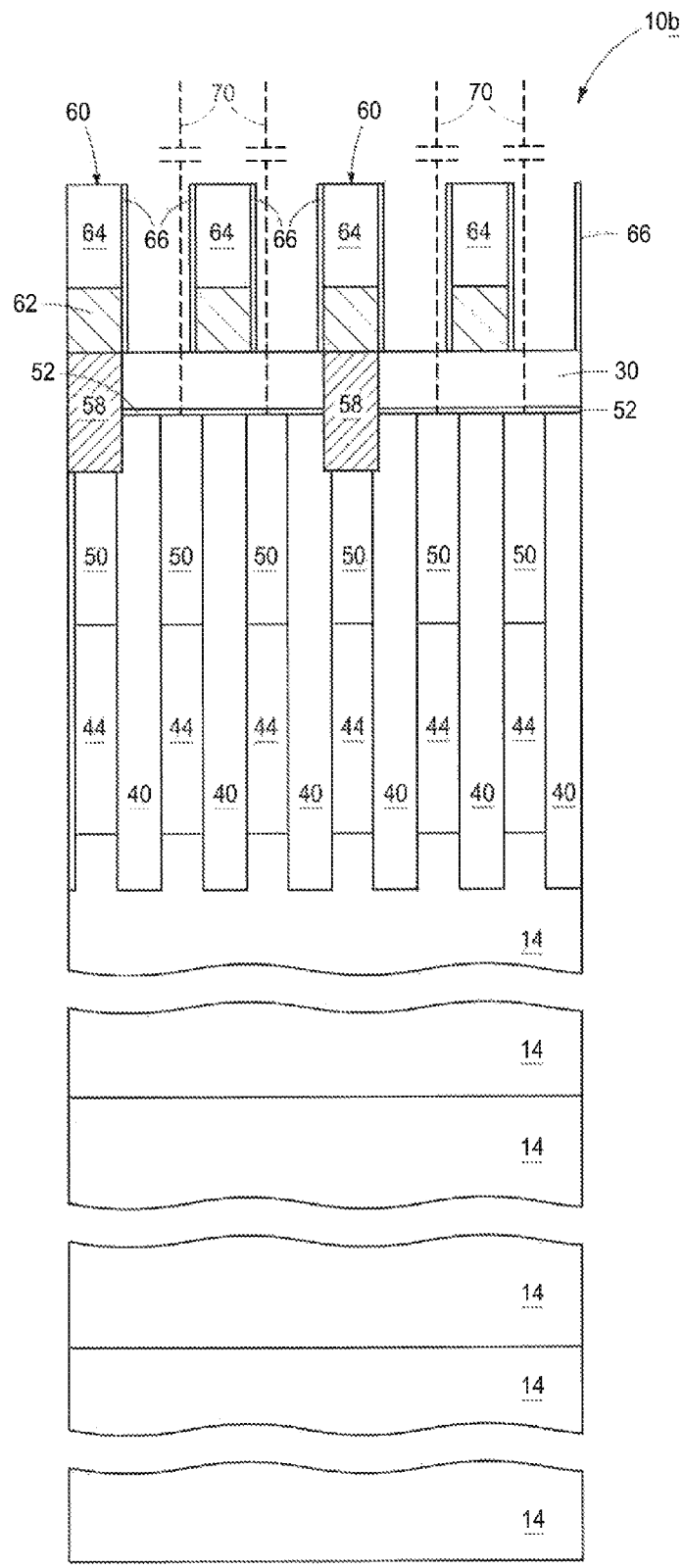
FIG. 26 is a hybrid schematic and structure view of the FIG. 23 substrate at a processing step subsequent to that shown by FIG. 23, and corresponds in processing sequence to that of FIG. 25.
Figure 27:
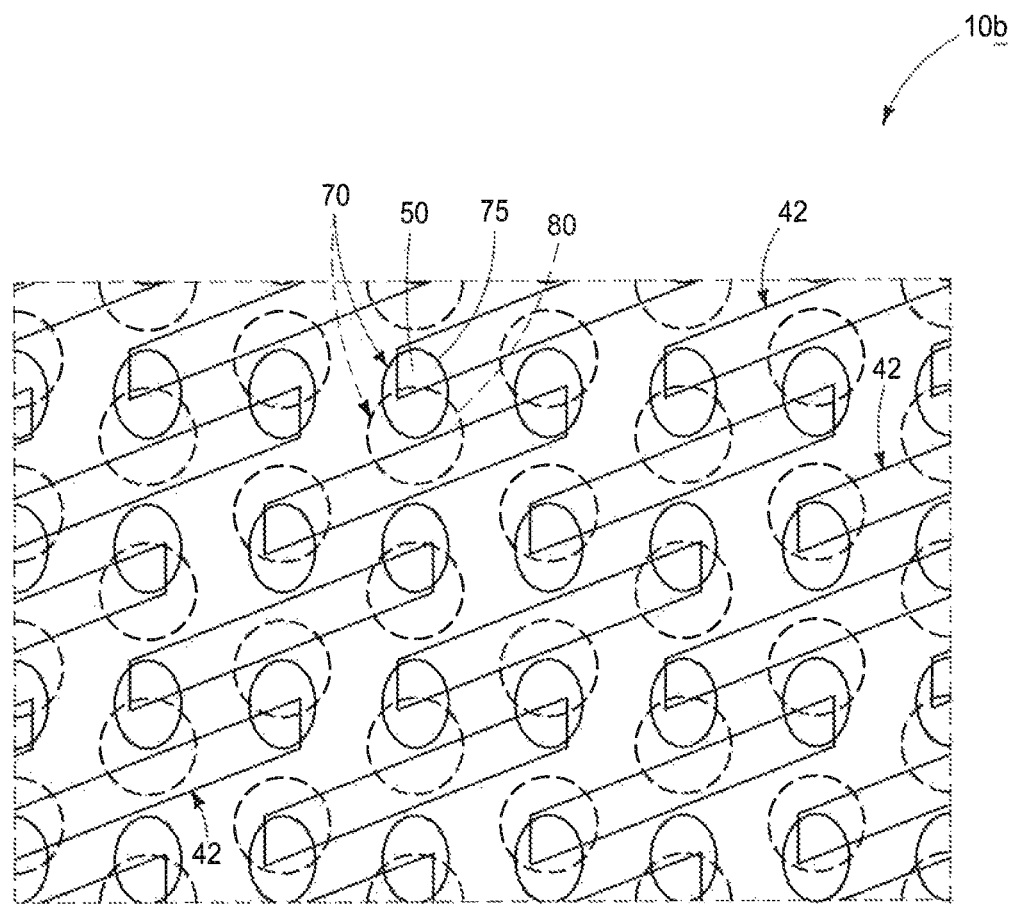
FIG. 27 is a diagrammatic view of the FIG. 21 substrate at a processing step subsequent to that shown by FIG. 21, corresponds in processing sequence to that of FIGS. 25 and 26, and wherein certain components have been removed for clarity.

Referring to FIGS. 21-24, example sense/bit line constructions 60 have been formed to be electrically coupled to conductive plugging material 58. Such are shown as comprising conductive material 62 (e.g., a stack of elemental titanium, tungsten nitride, and elemental tungsten) having a dielectric cap 64 (e.g., $Si_3N_4$) and dielectric sidewalls 66 (e.g., $Si_3N_4$) formed there-over. As referred to above with respect to FIG. 3, sharp corners of the various materials are shown in the Figures for clarity and ease of depiction, although such in reality will likely be rounded, perhaps considerably. For example, material 44 as shown in FIG. 24 would likely have a contour as identified by individual dashed lines 55, with materials 24, 26, and 28 then being formed conformally there-over.

Where memory integrated circuitry is being fabricated, in some such embodiments charge storage devices may be electrically coupled with semiconductor material, for example as is conventional and as shown as capacitors 70 schematically in FIGS. 25 and 26. As a specific example, such may be formed as container-like capacitors for example in conventional DRAM or other memory circuitry. FIG. 27 shows an example layout for capacitors 70 of a construction incorporating the circuitry of FIGS. 25 and 26. By way of example only, FIG. 27 shows example horizontal outlines for individual capacitor contact plugs 75 for electrically coupling to individual n-lightly doped drain regions 50 and for container-shaped storage node containers 80 of such capacitors electrically coupled to plugs 75. Only a single capacitor 70 with outlines 75 and 80 are designated with lead lines and numerals in FIG. 27 for clarity. Further, only active areas 42 are otherwise shown in FIG. 27 for clarity. Other memory, or other circuitry, whether existing our yet to be developed may be used, and independent of use of charge storage devices.

CONCLUSION

In some embodiments, a method of forming conductive material of a buried transistor gate line comprises adhering a precursor comprising tungsten and chlorine to material within a substrate trench. The precursor is reduced with hydrogen to form elemental-form tungsten material over the material within the substrate trench from the precursor.

In some embodiments, a method of forming a buried transistor gate line comprises forming a trench within a substrate comprising semiconductor material. Gate insulator material is formed along at least some of sidewalls and at least some of a base of the trench. Conductive gate material is formed over the gate insulator material. The forming of the conductive gate material comprises a) adhering a precursor comprising tungsten and chlorine over material within the trench; b) reducing the precursor with hydrogen to form elemental-form tungsten material over the material within the trench from the precursor; and c) iterating said adhering and reducing to overfill remaining volume of the trench. After overfilling remaining volume of the trench, uppermost portions of the gate insulator material and conductive gate material are removed to recess them within the trench.

In some embodiments, a method of forming a buried transistor gate line comprises forming a trench within a substrate comprising semiconductor material. Gate insulator material is formed along at least some of sidewalls and at least some of a base of the trench. Conductive gate material is formed over the gate insulator material. The forming of the conductive gate material comprises a) adhering a precursor comprising tungsten and chlorine over material within the trench; b) reducing the precursor with hydrogen to form elemental-form tungsten material over the material within the trench from the precursor; and c) forming elemental-form tungsten within the substrate trench using $WF_6$ after the reducing to overfill remaining volume of the trench. After overfilling remaining volume of the trench, uppermost portions of the gate insulator material and conductive gate material are removed to recess them within the trench.

In some embodiments, a method comprises forming in a semiconductor substrate a buried word line for a semiconductor memory device. The forming the buried word line comprises adhering a precursor over the semiconductor substrate. The precursor comprises tungsten and chlorine. The precursor is reduced with hydrogen to form atoms of tungsten. The semiconductor substrate may include a trench into which the buried word line is to be formed and the forming the buried word line may further comprise forming a liner titanium nitride film along a surface of the trench. The adhering and reducing may be repeated a plurality of times so that a tungsten film fills the trench with an intervention of the liner titanium nitride film between the tungsten film and semiconductor material of the semiconductor substrate. The adhering and reducing may be performed at least once to form tungsten film over the liner titanium nitride film and the forming the buried word line may further comprise forming an additional tungsten film over the tungsten film by using a chemical vapor deposition method, and the chemical vapor deposition method may use at least tungsten hexafluoride and hydrogen. Further, prior to forming the buried word line, first and second trench isolations may be formed in the semiconductor substrate to define an active region therebetween. A gate trench may be formed to intersect the first and second trench isolations and the active regions. A gate insulator material may be formed along an inside surface of the gate trench, and the buried word line may be formed within the gate trench to extend from the first trench isolation to the active region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming conductive material of a buried transistor gate line, comprising:
    adhering a precursor comprising tungsten and chlorine to material within a substrate trench;
    reducing the precursor with hydrogen to form elemental-form tungsten material over the material within the substrate trench from the precursor, an entirety of the forming the conductive material utilizing $H_2$ as the only reducing agent; and
    forming additional elemental-form tungsten within the substrate trench using $WF_6$ as a second precursor after the reducing.

2. The method of claim 1 wherein the precursor is formed using $WCl_6$.

3. The method of claim 1 wherein the precursor is adhered directly against the material within the substrate trench and that at least initially is TiN.

4. The method of claim 3 wherein the precursor that is adhered directly against the TiN is formed using $WCl_6$.

5. The method of claim 1 wherein the precursor is adhered directly against the material within the substrate trench.

6. The method of claim 1 wherein the adhering and reducing forms the elemental-form tungsten material to be devoid of chlorine.

7. The method of claim 1 wherein the adhering and reducing forms the elemental-form tungsten material to comprise chlorine.

8. The method of claim 7 wherein the adhering and reducing forms the elemental-form tungsten material to comprise chlorine at no greater than 0.4 atomic percent.

9. The method of claim 1 comprising repeating said adhering and reducing multiple times.

10. The method of claim 1 wherein the forming the additional elemental-form tungsten comprises chemical vapor deposition.

11. The method of claim 1 wherein the forming the additional elemental-form tungsten comprises atomic layer deposition.

12. The method of claim 1 comprising forming all of the conductive material of the buried transistor gate line that is within the substrate trench to be devoid of each of silicon and boron.

13. The method of claim 1 being devoid of using each of $SiH_4$ and $B_2H_6$ in forming all of the conductive material of the buried transistor gate line that is within the substrate trench.

14. A method of forming a buried transistor gate line, comprising:
    forming a trench within a substrate comprising semiconductor material;
    forming gate insulator material along at least some of sidewalls and at least some of a base of the trench;

forming conductive gate material over the gate insulator material, the forming of the conductive gate material comprising:

adhering a first precursor comprising tungsten and chlorine over material within the trench;

reducing the precursor with hydrogen to form elemental-form tungsten material over the material within the trench from the precursor; and after the reducing, utilizing WF6 as a second precursor to form additional elemental-form tungsten within the substrate trench, the additional elemental-form tungsten overfilling a remaining volume of the trench; and after overfilling the remaining volume of the trench, removing uppermost portions of the gate insulator material and conductive gate material to recess them within the trench.

15. The method of claim 14 comprising iterating said adhering and reducing prior to overfilling remaining volume of the trench.

16. The method of claim 14 wherein the forming the additional elemental-form tungsten comprises chemical vapor deposition.

17. The method of claim 4 wherein the forming the additional elemental-form tungsten comprises atomic layer deposition.

18. A method comprising forming in a semiconductor substrate a buried word line for a semiconductor memory device, the forming the buried word line comprising:

adhering a precursor over the semiconductor substrate, the precursor comprising tungsten and chlorine;

reducing the precursor with hydrogen to form atoms of tungsten, wherein $H_2$ is the only reducing agent utilized for producing the atoms of tungsten; and after the reducing, forming additional elemental-form over the substrate using $WF_6$ as a second precursor.

19. The method of claim 18 wherein the semiconductor substrate includes a trench into which the buried word line is to be formed and the forming the buried word line further comprises forming a liner titanium nitride film along a surface of the trench.

20. The method of claim 19 wherein the adhering and reducing are repeated a plurality of times so that a tungsten film fills the trench with an intervention of the liner titanium nitride film between the tungsten film and semiconductor material of the semiconductor substrate.

21. The method of claim 18 wherein the adhering and reducing are performed at least once to form tungsten film over the liner titanium nitride film and the forming the buried word line further comprising forming an additional tungsten film over the tungsten film by using a chemical vapor deposition method.

22. The method of claim 21 wherein the chemical vapor deposition method uses at least tungsten hexafluoride and hydrogen.

23. A method of forming a structure comprising:

forming first and second trench isolations in a semiconductor substrate to define an active region there-between;

forming a gate trench intersecting the first and second trench isolations and the active regions;

forming a gate insulator material along an inside surface of the gate trench; and forming in a semiconductor substrate a buried word line for a semiconductor memory device, the forming the buried word line comprising:

adhering a precursor over the semiconductor substrate, the precursor comprising tungsten and chlorine; and reducing the precursor with hydrogen to form atoms of tungsten, wherein $H_2$ is the only reducing agent utilized for producing the atoms of tungsten; wherein the buried word line is formed within the gate trench to extend from the first trench isolation to the active region.

* * * * *

UNITED STATES PATENT AND TRADEMARK OFFICE
CERTIFICATE OF CORRECTION

PATENT NO. : 9,768,177 B2  
APPLICATION NO. : 14/817458  
DATED : August 4, 2015  
INVENTOR(S) : Hidekazu Nobuto Page 1 of 1

It is certified that error appears in the above-identified patent and that said Letters Patent is hereby corrected as shown below:

In the Claims

Column 1, Line 67 Claim 14 – Replace "sidewalls and" with --the sidewalls and--

Column 11, Line 9 Claim 14 – Replace "WF6" with --$WF_6$--

Column 11, Line 23 Claim 17 – Replace "method of claim 4" with --method of claim 14--

Signed and Sealed this  
Seventh Day of November, 2017

Joseph Matal  
*Performing the Functions and Duties of the*  
*Under Secretary of Commerce for Intellectual Property and*  
*Director of the United States Patent and Trademark Office*